United States Patent
Sirski et al.

(10) Patent No.: US 11,309,828 B2
(45) Date of Patent: Apr. 19, 2022

(54) ROOF INTEGRATED PHOTOVOLTAIC MODULE WITH SPACER

(71) Applicant: GAF Energy LLC, Parsippany, NJ (US)

(72) Inventors: William Sirski, San Jose, CA (US); Thierry Nguyen, San Francisco, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 17/103,299

(22) Filed: Nov. 24, 2020

(65) Prior Publication Data

US 2021/0159844 A1    May 27, 2021

Related U.S. Application Data

(60) Provisional application No. 62/941,240, filed on Nov. 27, 2019.

(51) Int. Cl.
    *H02S 20/25*    (2014.01)
    *H02S 40/42*    (2014.01)
    *H02S 40/34*    (2014.01)

(52) U.S. Cl.
    CPC .............. *H02S 20/25* (2014.12); *H02S 40/34* (2014.12); *H02S 40/425* (2014.12)

(58) Field of Classification Search
    CPC ....................................................... H02S 20/25
    See application file for complete search history.

(56) References Cited

U.S. PATENT DOCUMENTS

| 4,636,577 | A |   | 1/1987  | Peterpaul |
|-----------|---|---|---------|-----------|
| 5,167,579 | A | * | 12/1992 | Rotter ........................ E04D 1/36  454/365 |
| 6,336,304 | B1 |  | 1/2002  | Mimura et al. |
| 6,341,454 | B1 |  | 1/2002  | Koleoglou |
| 7,155,870 | B2 |  | 1/2007  | Almy |
| 7,587,864 | B2 |  | 9/2009  | McCaskill et al. |
| 7,666,491 | B2 |  | 2/2010  | Yang et al. |
| 7,678,990 | B2 |  | 3/2010  | McCaskill et al. |
| 7,678,991 | B2 |  | 3/2010  | McCaskill et al. |
| 7,819,114 | B2 |  | 10/2010 | Augenbraun et al. |
| 7,824,191 | B1 |  | 11/2010 | Browder |
| 7,832,176 | B2 |  | 11/2010 | McCaskill et al. |
| 8,215,070 | B2 |  | 7/2012  | Railkar et al. |
| 8,371,076 | B2 |  | 2/2013  | Jones et al. |
| 8,468,754 | B2 |  | 6/2013  | Railkar et al. |
| 8,505,249 | B2 | * | 8/2013  | Geary ..................... H02S 20/23  52/173.3 |
| 8,512,866 | B2 |  | 8/2013  | Taylor |
| 8,623,499 | B2 |  | 1/2014  | Viasnoff |

(Continued)

FOREIGN PATENT DOCUMENTS

CA    2829440 A1    4/2014
WO    2011/049944 A1    4/2011

*Primary Examiner* — Daniel P Malley, Jr.
(74) *Attorney, Agent, or Firm* — Greenberg Traurig, LLP

(57) ABSTRACT

A photovoltaic module including a surface and at least one spacer juxtaposed with the surface. The at least one spacer is positioned intermediate the surface and the roof deck. The photovoltaic module is elevated from the roof deck by the spacer to promote air flow underneath the photovoltaic module. The spacer is made from a material that provides impact resistance and walkability.

16 Claims, 24 Drawing Sheets

(56) References Cited

U.S. PATENT DOCUMENTS

| | | |
|---|---|---|
| 8,713,860 B2 | 5/2014 | Railkar et al. |
| 8,925,262 B2 | 1/2015 | Railkar et al. |
| 8,994,224 B2 | 3/2015 | Mehta et al. |
| 9,145,498 B2 | 9/2015 | Ultsch |
| 9,169,646 B2 | 10/2015 | Rodrigues et al. |
| 9,171,991 B2 | 10/2015 | Pearce |
| 9,273,885 B2 | 3/2016 | Rodrigues et al. |
| 9,605,432 B1 | 3/2017 | Robbins |
| 9,670,353 B2 | 6/2017 | Peng et al. |
| 9,711,672 B2 | 7/2017 | Wang |
| 9,831,818 B2 | 11/2017 | West |
| 9,912,284 B2 | 3/2018 | Svec |
| 9,920,515 B2 | 3/2018 | Xing et al. |
| 9,923,515 B2 | 3/2018 | Rodrigues et al. |
| 9,987,786 B2 | 6/2018 | Stoiljkovic et al. |
| 9,991,412 B2 | 6/2018 | Gonzalez et al. |
| 10,015,933 B2 | 7/2018 | Boldrin |
| 10,027,273 B2 | 7/2018 | West et al. |
| 10,115,850 B2 | 10/2018 | Rodrigues et al. |
| 10,179,852 B2 | 1/2019 | Gossi et al. |
| 10,187,005 B2 | 1/2019 | Rodrigues et al. |
| 10,256,765 B2 | 4/2019 | Rodrigues et al. |
| 10,480,192 B2 | 11/2019 | Xing et al. |
| 10,669,414 B2 | 6/2020 | Li et al. |
| 10,907,355 B2 | 2/2021 | Hubbard et al. |
| 10,914,063 B2 | 2/2021 | Lee et al. |
| RE48,555 E | 5/2021 | Cancio et al. |
| 11,015,085 B2 | 5/2021 | Bruns et al. |
| 11,065,849 B2 | 7/2021 | Ackermann et al. |
| 2002/0053360 A1 | 5/2002 | Kinoshita et al. |
| 2002/0102422 A1 | 8/2002 | Hubbard et al. |
| 2003/0132265 A1* | 7/2003 | Villela ............ B25C 7/00 227/142 |
| 2003/0217768 A1 | 11/2003 | Guha |
| 2005/0115603 A1 | 6/2005 | Yoshida et al. |
| 2005/0144870 A1 | 7/2005 | Dinwoodie |
| 2006/0042683 A1 | 3/2006 | Gangemi |
| 2007/0181174 A1 | 8/2007 | Ressler |
| 2008/0006323 A1 | 1/2008 | Kalkanoglu et al. |
| 2008/0035140 A1 | 2/2008 | Placer et al. |
| 2008/0271774 A1* | 11/2008 | Kalkanoglu ...... H01L 31/02008 136/244 |
| 2008/0315061 A1 | 12/2008 | Fath |
| 2009/0000222 A1* | 1/2009 | Kalkanoglu ............ H02S 20/25 52/173.3 |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0159118 A1 | 6/2009 | Kalkanoglu |
| 2009/0229652 A1 | 9/2009 | Mapel et al. |
| 2010/0101634 A1 | 4/2010 | Frank et al. |
| 2010/0146878 A1* | 6/2010 | Koch ...................... H02S 40/36 52/173.3 |
| 2010/0313499 A1 | 12/2010 | Gangemi |
| 2010/0326488 A1 | 12/2010 | Aue et al. |
| 2011/0030761 A1 | 2/2011 | Kalkanoglu et al. |
| 2011/0036386 A1 | 2/2011 | Browder |
| 2011/0048507 A1 | 3/2011 | Livsey et al. |
| 2011/0058337 A1 | 3/2011 | Han |
| 2011/0132427 A1 | 6/2011 | Kalkanoglu et al. |
| 2011/0302859 A1 | 12/2011 | Crasnianski |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2013/0014455 A1 | 1/2013 | Grieco |
| 2014/0179220 A1* | 6/2014 | Railkar .................... F24S 20/69 454/365 |
| 2014/0311556 A1* | 10/2014 | Feng ........................ H02S 20/25 136/251 |
| 2015/0024159 A1 | 1/2015 | Bess et al. |
| 2016/0359451 A1 | 12/2016 | Mao et al. |
| 2017/0159292 A1 | 6/2017 | Chihlas et al. |
| 2017/0203555 A1 | 7/2017 | Wang et al. |
| 2018/0094438 A1 | 4/2018 | Wu et al. |
| 2018/0094439 A1 | 4/2018 | Wang et al. |
| 2018/0281347 A1 | 10/2018 | Gossi |
| 2018/0351502 A1 | 12/2018 | Almy et al. |
| 2019/0165720 A1* | 5/2019 | Quinlan ............ H01L 31/0504 |
| 2020/0020819 A1 | 1/2020 | Farhangi |
| 2020/0224419 A1 | 7/2020 | Boss et al. |
| 2020/0343397 A1* | 10/2020 | Hem-Jensen ..... H01L 31/02168 |
| 2021/0002898 A1 | 1/2021 | Knebel et al. |
| 2021/0095474 A1 | 4/2021 | Yang et al. |
| 2021/0113970 A1 | 4/2021 | Stainer et al. |
| 2021/0171808 A1 | 6/2021 | Ackermann et al. |
| 2021/0172174 A1 | 6/2021 | Ackermann et al. |

* cited by examiner

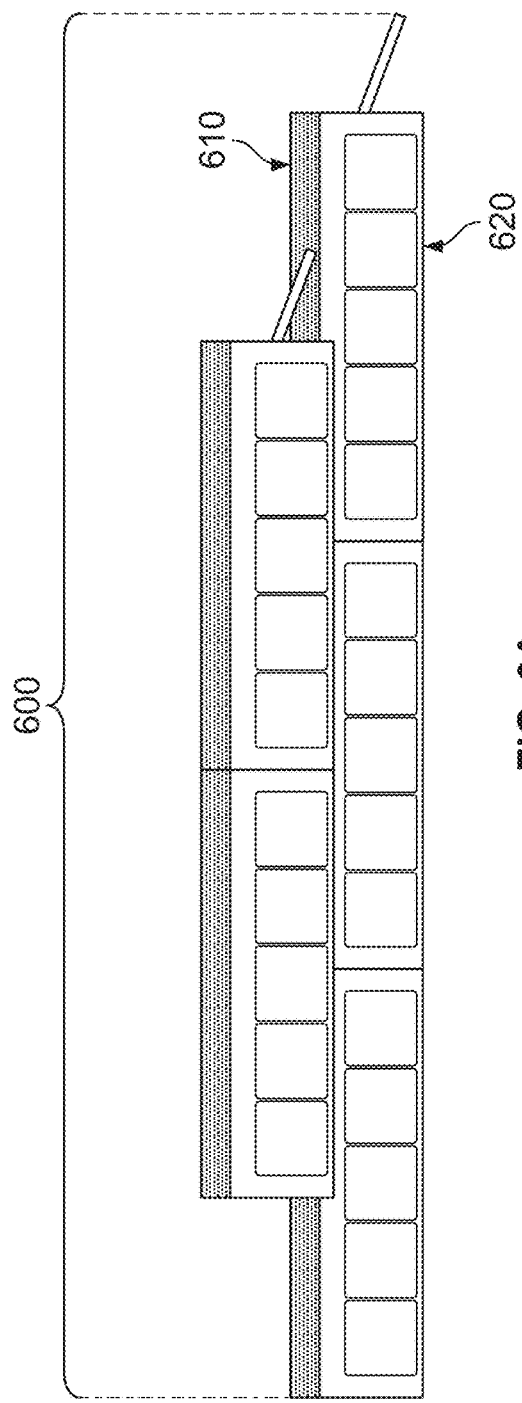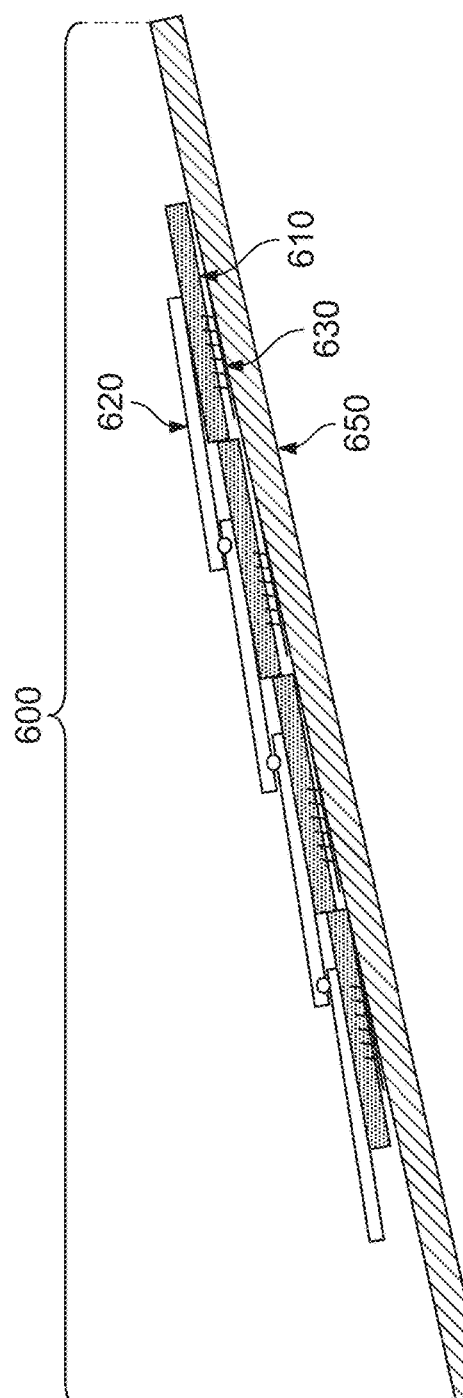

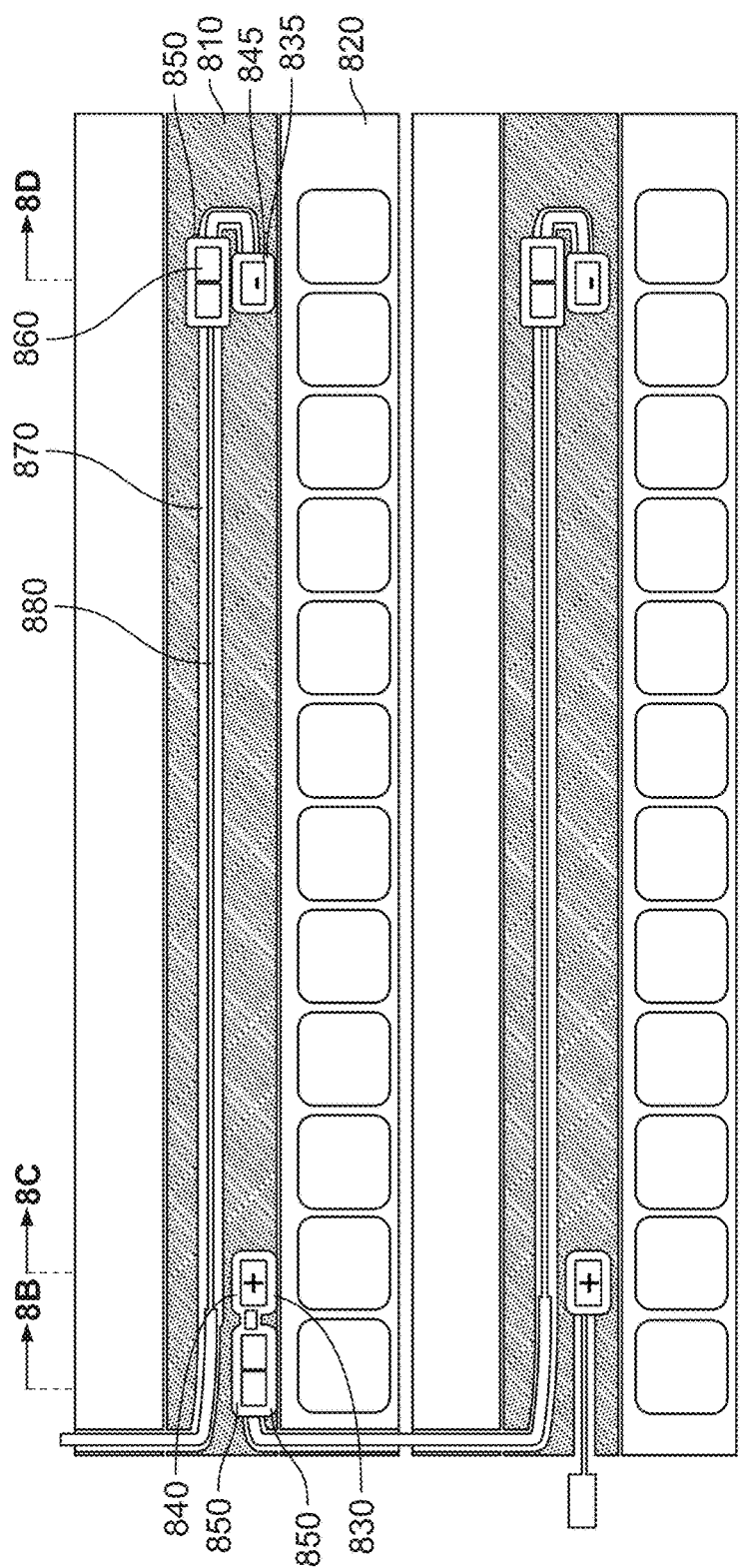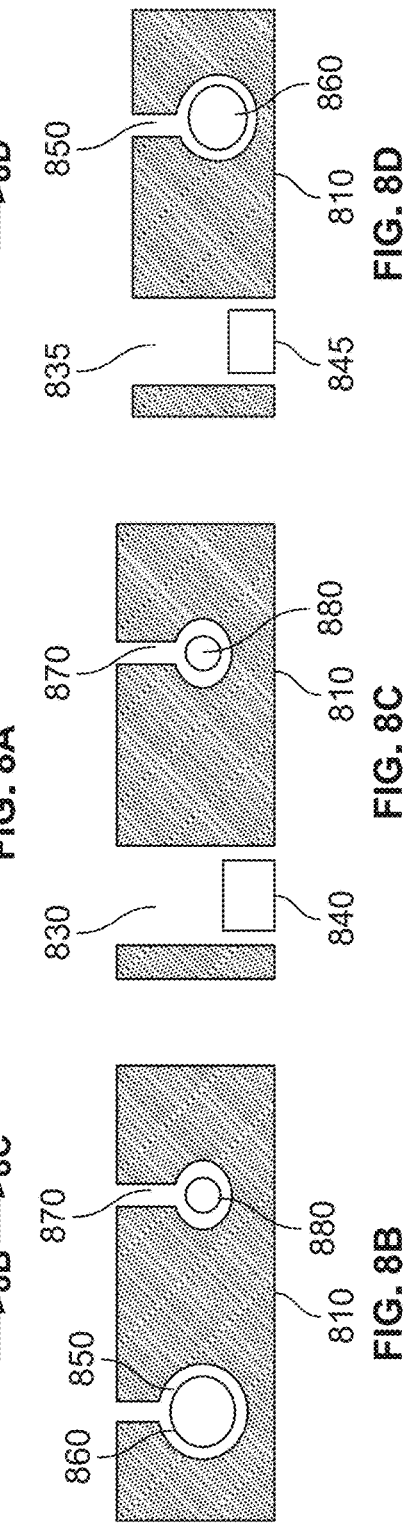

|  | Collection Sta | Collection En | Units |
|---|---|---|---|
| Time | 11:18 | 11:44 | - |
| Tamb | 15.7 | 18.4 | C |
| Wind Speed | 0 | 0 | m/s |
| Irradiance Direction | 20.3 | 20.7 | deg |
| Irradiance | 750 | 800 | W/m^2 |

|  | 1 ft from Left | | Center | | 1 ft from Right | |
|---|---|---|---|---|---|---|
| 1 ft from Top | Temp | 49.3 | Temp | 50.6 | Temp | 46.8 |
|  | Heat Flux | 65 | Heat Flux | 20 | Heat Flux | 100 |
| Center | Temp | 48.3 | Temp | 45.9 | Temp | 47.5 |
|  | Heat Flux | 35 | Heat Flux | 44 | Heat Flux | 42 |
| 1 ft from Bottom | Temp | 46.7 | Temp | 46.7 | Temp | 46.4 |
|  | Heat Flux | 71 | Heat Flux | 41 | Heat Flux | 60 |
|  | Air Velocity | 0.1 | Air Velocity | 0 | Air Velocity | 0.1 |

FIG. 15

|  | Collection Sta | Collection En | Units |
|---|---|---|---|
| Time | 13:01 | 13:30 | - |
| Tamb | 21 | 22.3 | C |
| Wind Speed | 0 | 0 | m/s |
| Irradiance Direction | 20.4 | 21.1 | deg |
| Irradiance | 870 | 880 | W/m^2 |

|  | 1 ft from Left | 1 ft from Left | Center | Center | 1 ft from Right | 1 ft from Right |
|---|---|---|---|---|---|---|
| 1 ft from Top | Temp | 51.2 | Temp | 51.5 | Temp | 56.3 |
|  | Heat Flux | 63 | Heat Flux | 20 | Heat Flux | 35 |
| Center | Temp | 54.6 | Temp | 55.3 | Temp | 59 |
|  | Heat Flux | 32 | Heat Flux | 0 | Heat Flux | 60 |
| 1 ft from Bottom | Temp | 59.3 | Temp | 55.4 | Temp | 58 |
|  | Heat Flux | 47 | Heat Flux | 46.7 | Heat Flux | 45 |
|  | Air Velocity | 0.1 | Air Velocity | 0.1 | Air Velocity | 0 |

|  | 0 ft | 0 ft | 1 ft | 1 ft | 2 ft | 2 ft |
|---|---|---|---|---|---|---|
| Distance to Left | Temp | 45.1 | Temp | 50.6 | Temp | 53.3 |
|  | Heat Flux |  | Heat Flux |  | Heat Flux |  |
| Distance Down | Temp | 45.6 | Temp | 58.2 | Temp | 56.1 |
|  | Heat Flux |  | Heat Flux |  | Heat Flux |  |
| Distance to Right | Temp | 49.3 | Temp | 61.7 | Temp | 58 |
|  | Heat Flux |  | Heat Flux |  | Heat Flux |  |

FIG. 16

| Measured Values | | | Calculated |
|---|---|---|---|
| Average Ambient Temperature | 17.05 | [C] | 25 |
| Average Ambient Irradiance | 775 | [W/m^2] | 1000 |
| Sun Angle | 0.24958 | [rad] | 0 |
| Reflectivity of Substrate | 0.2 | [-] | 0.02 |
| Emissivity of Substrate | 0.92 | [-] | 0.84 |
| Average Surface Temperature | 47.5778 | [C] | 74.8 |
| Average Measured Q"back | 53.1111 | [W/m^2] | 86.6 |
| Q"irrad | 600.7898 | [W/m^2] | 980 |
| Q"rad | 181.7397 | [W/m^2] | 296 |
| R"conv | 0.083423 | [W/m^2] | 0.083423153 |
| R"back | 0.574791 | [K*m^2/W] | 0.574790795 |
| R"rad | 0.167975 | [K*m^2/W] | 0.167975257 |

FIG. 17

| Measured Values | | | Calculated |
|---|---|---|---|
| Average Ambient Temperature | 21.65 | [C] | 25 |
| Average Ambient Irradiance | 875 | [W/m^2] | 1000 |
| Sun Angle | 0.29932 | [rad] | 0 |
| Reflectivity of Substrate | 0.2 | [-] | 0.02 |
| Emissivity of Substrate | 0.92 | [-] | 0.84 |
| Average Surface Temperature | 55.6222 | [C] | 74.8 |
| Average Measured Q"back | 38.7444 | [W/m^2] | 56.8 |
| Q"irrad | 668.8752 | [W/m^2] | 980 |
| Q"rad | 215.1724 | [W/m^2] | 315 |
| R"conv | 0.081869 | [W/m^2] | 0.081868979 |
| R"back | 0.876828 | [K*m^2/W] | 0.876828219 |
| R"rad | 0.157884 | [K*m^2/W] | 0.157883756 |

FIG. 18

| Measured Values | | | Calculated |
|---|---|---|---|
| Average Ambient Temperature | 22.9 | [C] | 25 |
| Average Ambient Irradiance | 800 | [W/m^2] | 1000 |
| Sun Angle | 0.29932 | [rad] | 0 |
| Reflectivity of Substrate | 0.2 | [-] | 0.02 |
| Emissivity of Substrate | 0.92 | [-] | 0.84 |
| Average Surface Temperature | 57 | [C] | 79.6 |
| Average Measured Q"back | 125 | [W/m^2] | 200.3 |
| Q"irrad | 611.5431 | [W/m^2] | 980 |
| Q"rad | 218.7244 | [W/m^2] | 351 |
| R"conv | 0.127325 | [W/m^2] | 0.12732497 |
| R"back | 0.2728 | [K*m^2/W] | 0.2728 |
| R"rad | 0.155904 | [K*m^2/W] | 0.155903934 |

ROOF INTEGRATED PHOTOVOLTAIC MODULE WITH SPACER

CROSS-REFERENCE TO RELATED APPLICATION

This application is a Section 111(a) application relating to and claiming the benefit of commonly-owned, U.S. Provisional Patent Application Ser. No. 62/941,240, filed Nov. 27, 2019, entitled "ROOF INTEGRATED PHOTOVOLTAIC MODULE WITH SPACER," the contents of which is incorporated herein by reference in its entirety.

FIELD OF THE INVENTION

The present invention relates to roof-integrated photovoltaic modules. More particularly, the present invention relates to roof-integrated photovoltaic modules with integrated underlying spacers providing impact protection and cable routing.

BACKGROUND

Solar modules placed on building roofs (e.g., residential roofs) are in danger of damage and efficiency loss from elevated temperatures and impacts. High temperatures can increase the degradation of various solar module components. Solar cell efficiency is also tied to temperature, with high temperatures leading to lower efficiency for most solar cells. Impacts from hail, tools, or other objects can also harm solar cells and solar modules. Junction boxes, cables and connectors need to be kept off the roof for reliability and safety reasons.

SUMMARY OF THE INVENTION

In an embodiment, a system includes a plurality of photovoltaic modules, each of the photovoltaic modules including a first end, a second end opposite the first end, a first surface extending from the first end to the second end, a second surface opposite the first surface and extending from the first end to the second end, and at least one spacer juxtaposed with the second surface, wherein the at least one spacer includes a fiber wool, wherein the at least one spacer includes a density of 40 kg/m$^3$ to 150 kg/m$^3$ and a crush strength of 29 psi to 200 psi, wherein the photovoltaic modules are configured to be installed on a roof deck, and wherein the at least one spacer is positioned between the second surface and the roof deck.

In an embodiment, the second surface includes a surface area, and wherein the at least one spacer covers the surface area in its entirety. In an embodiment, the second surface includes a surface area, and wherein the at least one spacer covers at least a portion of the surface area. In an embodiment, at least a portion of the at least one spacer extends outwardly from the first end. In an embodiment, the at least one spacer includes a plurality of spacers. In an embodiment, the plurality of spacers is arranged in an array. In an embodiment, each of the plurality of spacers includes a rectangular profile. In an embodiment, each of the plurality of spacers includes a circular profile. In an embodiment, the at least one spacer is attached to the second surface. In an embodiment, the at least one spacer includes a thickness of 5 mm to 50 mm.

In an embodiment, the at least one spacer includes at least one cutout that is sized and shaped to receive at least one electrical component. In an embodiment, the at least one electrical component includes a junction box. In an embodiment, the at least one electrical component includes an electrical connector. In an embodiment, the system further includes a fan installed on the roof deck and adjacent to the at least one of the plurality of photovoltaic modules, and wherein the fan is configured to exhaust air through the at least one spacer of the at least one of the photovoltaic modules.

In an embodiment, the plurality of photovoltaic modules includes a first photovoltaic module and a second photovoltaic module, wherein the at least one spacer of each of the first photovoltaic module and the second photovoltaic module covers a portion of the second surface thereof, and wherein an uncovered portion of the second surface of the first photovoltaic module overlaps the first surface of the second photovoltaic module. In an embodiment, the at least one spacer of the first photovoltaic module is proximate to the at least one spacer of the second photovoltaic module. In an embodiment, the system further includes at least one hooking loop adapted to be attached to the roof deck, wherein the at least one hooking loop is configured to engage the at least one spacer. In an embodiment, the at least one spacer includes a nail plate configured to receive at least one nail. In an embodiment, the system further includes a watershedding layer located between the at least one spacer and the roof deck. In an embodiment, the fiber wool is a composite fiber wool.

BRIEF DESCRIPTION OF THE DRAWINGS

FIG. 6A shows a front view of an exemplary embodiment of an exemplary embodiment of a PV module and a spacer that is attached to an exemplary roof deck using at least one hooking loop.

FIG. 6B shows a side view of the exemplary embodiment of FIG. 6A.

FIG. 8A shows a rear view of an exemplary embodiment of a PV module and a spacer that includes cutouts to accommodate electronic components of the PV module.

FIG. 8B shows a cross-sectional view taken at the location indicated as "8B" in FIG. 8A.

FIG. 8C shows a cross-sectional view taken at the location indicated as "8C" in FIG. 8A.

FIG. 8D shows a cross-sectional view taken at the location indicated as "8D" in FIG. 8A.

FIG. 15 shows a tabular view of test data for an experimental roofing shingle and spacer obtained without an experimental fan.

FIG. 16 shows a tabular view of test data for an experimental roofing shingle and spacer obtained without an experimental fan.

FIG. 17 shows a tabular view of converted test data for an experimental roofing shingle and spacer obtained with an experimental fan.

FIG. 18 shows a tabular view of converted test data for an experimental roofing shingle and spacer obtained without an experimental fan.

DETAILED DESCRIPTION

Figure 1A:
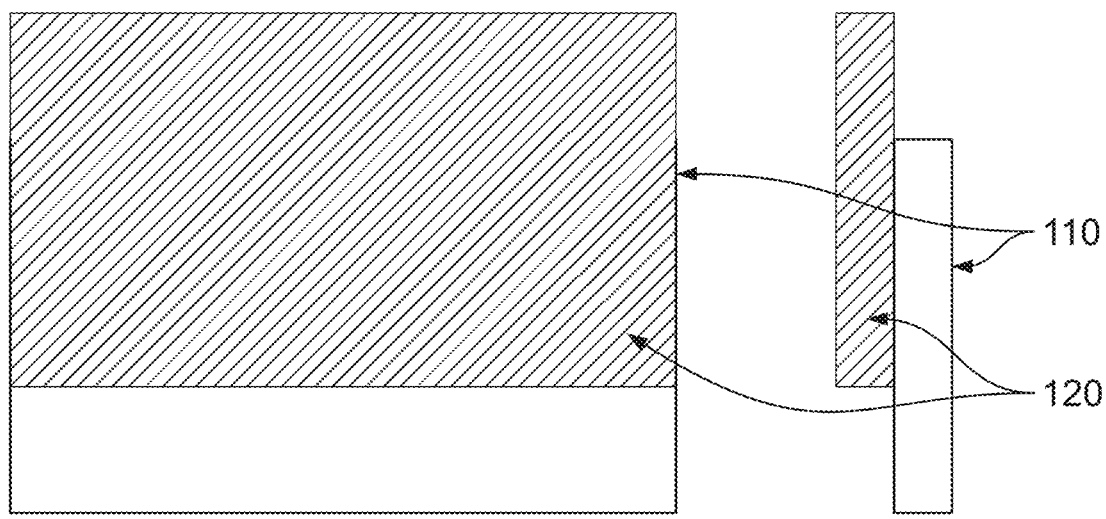
FIG. 1A shows a front view and a side view of an exemplary embodiment of a PV module and a spacer.

The present invention will be further explained with reference to the attached drawings, wherein like structures are referred to by like numerals throughout the several views. The drawings shown are not necessarily to scale, with emphasis instead generally being placed upon illustrating the principles of the present invention. Further, some features may be exaggerated to show details of particular components.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

Throughout the specification and claims, the following terms take the meanings explicitly associated herein, unless the context clearly dictates otherwise. The phrases "in one embodiment" and "in some embodiments" as used herein do not necessarily refer to the same embodiment(s), though they may. Furthermore, the phrases "in another embodiment" and "in some other embodiments" as used herein do not necessarily refer to a different embodiment, although they may. Thus, as described below, various embodiments of the invention may be readily combined, without departing from the scope or spirit of the invention.

The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The exemplary embodiments relate to the use of spacers (e.g., elastomeric or polymeric spacers) to mitigate impact damage and to regulate temperatures within a photovoltaic ("PV") module that is configured to be integrated into a roof of a structure. In some embodiments, such spacers are provided in various shapes. In some embodiments, such spacers can be used as the module attachment to the roof surface. In some embodiments, such spacers can attach like an underlayment to the roof surface. In some embodiments, such spacers can be unattached to the roof or module. In some embodiments, various types of spacer construction can be used, including, but not limited to, a plastic mat, a rubber extrusion, a plastic extrusion, a rubber molding, a plastic molding, a wood product, a foam product, or a molded fiber part. In some embodiments, such spacers have will have cable routing features incorporated into the design thereof.

In some embodiments, one or more spacers are attached to a PV module to address one or more of three needs, i.e., (1) impact protection, (2) ventilation to prevent degradation due to heat, and (3) cable routing. In some embodiments, the geometry of the one or more spacers (e.g., the size of the one or more spacers, the location of the one or more spacers, etc.) is optimized to address one or more of these issues. In some embodiments, in order to aid the PV module's ability to survive impacts, the one or more spacers are made of a flexible material. In some embodiments, a spacer material includes, but is not limited to, fiberglass, carbon fiber polypropylene, polyethylene, ethylene propylene diene monomer ("EPDA"), ethylene-vinyl acetate ("EVA"), silicone rubber, urethane rubber, epoxy, polyester, nylon, a polystyrene-containing resin from the family of resins commercialized by SABIC of Riyadh, Saudi Arabia under the trade name NORYL®, bitumen, styrene-butadiene-styrene ("SBS"), polyisocyanurate foam, wood fiber, or a composite including more than one of the above materials.

In some embodiments, a spacer has a thickness (e.g., a size of the spacer in the dimension measured between the PV module and the underlying roof deck) that is between 5 mm and 50 mm. In some embodiments, the thickness is between 5 mm and 45 mm. In some embodiments, the thickness is between 5 mm and 40 mm. In some embodiments, the thickness is between 5 mm and 35 mm. In some embodiments, the thickness is between 5 mm and 30 mm. In some embodiments, the thickness is between 5 mm and 25 mm. In some embodiments, the thickness is between 5 mm and 20 mm. In some embodiments, the thickness is between 5 mm and 15 mm. In some embodiments, the thickness is between 5 mm and 10 mm. In some embodiments, the thickness is between 10 mm and 50 mm. In some embodiments, the thickness is between 10 mm and 45 mm. In some embodiments, the thickness is between 10 mm and 40 mm. In some embodiments, the thickness is between 10 mm and 35 mm. In some embodiments, the thickness is between 10 mm and 30 mm. In some embodiments, the thickness is between 10 mm and 25 mm. In some embodiments, the thickness is between 10 mm and 20 mm. In some embodiments, the thickness is between 10 mm and 15 mm. In some embodiments, the thickness is between 15 mm and 50 mm. In some embodiments, the thickness is between 15 mm and 45 mm. In some embodiments, the thickness is between 15 mm and 40 mm. In some embodiments, the thickness is between 15 mm and 35 mm. In some embodiments, the thickness is between 15 mm and 30 mm. In some embodiments, the thickness is between 15 mm and 25 mm. In some embodiments, the thickness is between 15 mm and 20 mm. In some embodiments, the thickness is between 20 mm and 50 mm. In some embodiments, the thickness is between 20 mm and 45 mm. In some embodiments, the thickness is between 20 mm and 40 mm. In some embodiments, the thickness is between 20 mm and 35 mm. In some embodiments, the thickness is between 20 mm and 30 mm. In some embodiments, the thickness is between 20 mm and 25 mm. In some embodiments, the thickness is between 25 mm and 50 mm. In some embodiments, the thickness is between 25 mm and 45 mm. In some embodiments, the thickness is between 25 mm and 40 mm. In some embodiments, the thickness is between 25 mm and 35 mm. In some embodiments, the thickness is between 25 mm and 30 mm. In some embodiments, the thickness is between 30 mm and 50 mm. In some embodiments, the thickness is between 30 mm and 45 mm. In some embodiments, the thickness is between 30 mm and 40 mm. In some embodiments, the thickness is between 30 mm and 35 mm. In some embodiments, the thickness is between 35 mm and 50 mm. In some embodiments, the thickness is between 35 mm and 45 mm. In some embodiments, the thickness is between 35 mm and 40 mm. In some embodiments, the thickness is between 40 mm and 50 mm. In some embodiments, the thickness is between 40 mm and 45 mm. In some embodiments, the thickness is between 45 mm and 50 mm.

In some embodiments, at least one spacer underlying a PV module is sufficiently configured (e.g., sized, shaped, positioned, made using a suitable material, etc.) such that the PV module underlain by the at least one spacer passes the UL 1703 standard for impact resistance and the IEC 61730 standard for hail resistance. The UL 1703 test involves attaching the PV module to a representative model of a roof and dropping a 2-inch diameter steel ball onto the PV module from 1.3 m. A PV module is deemed to pass the UL 1703 standard if there are no exposed electrical components and no large pieces of glass are ejected. The IEC 61730 test involves the impact of 11 simulated hail strikes which are 25 mm in diameter and traveling at 23 m/s on the sensitive portions of the module. A system has passed the IEC 61730 hail impact test if the power loss in the module is less than 5%.

In some embodiments, at least one spacer underlying a PV module is sufficiently configured (e.g., sized, shaped, positioned, made using a suitable material, etc.) such that the PV module underlain by the at least one spacer passes the UL 7103 standard for walkability (e.g., a "200 pound roofer test"). This test involves attaching the PV module to a representative model of a roof and setting a 200-pound weight on a 3-inch diameter puck on the PV module for 30 minutes. A PV module is deemed to pass the UL 7103 standard if there are no penetrations at the end of the 30-minute time period.

In some embodiments, at least one spacer underlying a PV module is sufficiently configured (e.g., sized, shaped, positioned, made using a suitable material, etc.) such that the at least one spacer provides a suitable elastic stiffness. In some embodiments, the spring coefficient is in the range of 1-50 pounds-force per cubic inch. In some embodiments, the stiffness can be determined by choice of fiber material, diameter of fiber material, fill factor, choice of binder, and quantity of binder applied.

In some embodiments, the at least one spacer includes a density of 40 kg/m$^3$ to 1,000 kg/m$^3$. In some embodiments, the at least one spacer includes a density of 40 kg/m$^3$ to 950 kg/m$^3$. In some embodiments, the at least one spacer includes a density of 40 kg/m$^3$ to 900 kg/m$^3$. In some embodiments, the at least one spacer includes a density of 40 kg/m$^3$ to 850 kg/m$^3$. In some embodiments, the at least one spacer includes a density of 40 kg/m$^3$ to 800 kg/m$^3$. In some embodiments, the at least one spacer includes a density of 40 kg/m$^3$ to 750 kg/m$^3$. In some embodiments, the at least one spacer includes a density of 40 kg/m$^3$ to 700 kg/m$^3$. In some embodiments, the at least one spacer includes a density of 40 kg/m$^3$ to 650 kg/m$^3$. In some embodiments, the at least one spacer includes a density of 40 kg/m$^3$ to 600 kg/m$^3$. In some embodiments, the at least one spacer includes a density of 40 kg/m³ to 550 kg/m³. In some embodiments, the at least one spacer includes a density of 40 kg/m³ to 500 kg/m³. In some embodiments, the at least one spacer includes a density of 40 kg/m³ to 450 kg/m³. In some embodiments, the at least one spacer includes a density of 40 kg/m³ to 400 kg/m³. In some embodiments, the at least one spacer includes a density of 40 kg/m³ to 350 kg/m³. In some embodiments, the at least one spacer includes a density of 40 kg/m³ to 300 kg/m³. In some embodiments, the at least one spacer includes a density of 40 kg/m³ to 250 kg/m³. In some embodiments, the at least one spacer includes a density of 40 kg/m³ to 200 kg/m³. In some embodiments, the at least one spacer includes a density of 40 kg/m³ to 150 kg/m³. In some embodiments, the at least one spacer includes a density of 40 kg/m³ to 100 kg/m³. In some embodiments, the at least one spacer includes a density of 40 kg/m³ to 50 kg/m³.

In some embodiments, the at least one spacer includes a density of 50 kg/m³ to 1,000 kg/m³. In some embodiments, the at least one spacer includes a density of 50 kg/m³ to 950 kg/m³. In some embodiments, the at least one spacer includes a density of 50 kg/m³ to 900 kg/m³. In some embodiments, the at least one spacer includes a density of 50 kg/m³ to 850 kg/m³. In some embodiments, the at least one spacer includes a density of 50 kg/m³ to 800 kg/m³. In some embodiments, the at least one spacer includes a density of 50 kg/m³ to 750 kg/m³. In some embodiments, the at least one spacer includes a density of 50 kg/m³ to 700 kg/m³. In some embodiments, the at least one spacer includes a density of 50 kg/m³ to 650 kg/m³. In some embodiments, the at least one spacer includes a density of 50 kg/m³ to 600 kg/m³. In some embodiments, the at least one spacer includes a density of 50 kg/m³ to 550 kg/m³. In some embodiments, the at least one spacer includes a density of 50 kg/m³ to 500 kg/m³. In some embodiments, the at least one spacer includes a density of 50 kg/m³ to 450 kg/m³. In some embodiments, the at least one spacer includes a density of 50 kg/m³ to 400 kg/m³. In some embodiments, the at least one spacer includes a density of 50 kg/m³ to 350 kg/m³. In some embodiments, the at least one spacer includes a density of 50 kg/m³ to 300 kg/m³. In some embodiments, the at least one spacer includes a density of 50 kg/m³ to 250 kg/m³. In some embodiments, the at least one spacer includes a density of 50 kg/m³ to 200 kg/m³. In some embodiments, the at least one spacer includes a density of 50 kg/m³ to 150 kg/m³. In some embodiments, the at least one spacer includes a density of 50 kg/m³ to 100 kg/m³.

In some embodiments, the at least one spacer includes a density of 100 kg/m³ to 1,000 kg/m³. In some embodiments, the at least one spacer includes a density of 100 kg/m³ to 950 kg/m³. In some embodiments, the at least one spacer includes a density of 100 kg/m³ to 900 kg/m³. In some embodiments, the at least one spacer includes a density of 100 kg/m³ to 850 kg/m³. In some embodiments, the at least one spacer includes a density of 100 kg/m³ to 800 kg/m³. In some embodiments, the at least one spacer includes a density of 100 kg/m³ to 750 kg/m³. In some embodiments, the at least one spacer includes a density of 100 kg/m³ to 700 kg/m³. In some embodiments, the at least one spacer includes a density of 100 kg/m³ to 650 kg/m³. In some embodiments, the at least one spacer includes a density of 100 kg/m³ to 600 kg/m³. In some embodiments, the at least one spacer includes a density of 100 kg/m³ to 550 kg/m³. In some embodiments, the at least one spacer includes a density of 100 kg/m³ to 500 kg/m³. In some embodiments, the at least one spacer includes a density of 100 kg/m³ to 450 kg/m³. In some embodiments, the at least one spacer includes a density of 100 kg/m³ to 400 kg/m³. In some embodiments, the at least one spacer includes a density of 100 kg/m³ to 350 kg/m³. In some embodiments, the at least one spacer includes a density of 100 kg/m³ to 300 kg/m³. In some embodiments, the at least one spacer includes a density of 100 kg/m³ to 250 kg/m³. In some embodiments, the at least one spacer includes a density of 100 kg/m³ to 200 kg/m³. In some embodiments, the at least one spacer includes a density of 100 kg/m³ to 150 kg/m³.

In some embodiments, the at least one spacer includes a density of 150 kg/m³ to 1,000 kg/m³. In some embodiments, the at least one spacer includes a density of 150 kg/m³ to 950 kg/m³. In some embodiments, the at least one spacer includes a density of 150 kg/m³ to 900 kg/m³. In some embodiments, the at least one spacer includes a density of 150 kg/m³ to 850 kg/m³. In some embodiments, the at least one spacer includes a density of 150 kg/m³ to 800 kg/m³. In some embodiments, the at least one spacer includes a density of 150 kg/m³ to 750 kg/m³. In some embodiments, the at least one spacer includes a density of 150 kg/m³ to 700 kg/m³. In some embodiments, the at least one spacer includes a density of 150 kg/m³ to 650 kg/m³. In some embodiments, the at least one spacer includes a density of 150 kg/m³ to 600 kg/m³. In some embodiments, the at least one spacer includes a density of 150 kg/m³ to 550 kg/m³. In some embodiments, the at least one spacer includes a density of 150 kg/m³ to 500 kg/m³. In some embodiments, the at least one spacer includes a density of 150 kg/m³ to 450 kg/m³. In some embodiments, the at least one spacer includes a density of 150 kg/m³ to 400 kg/m³. In some embodiments, the at least one spacer includes a density of 150 kg/m³ to 350 kg/m³. In some embodiments, the at least one spacer includes a density of 150 kg/m³ to 300 kg/m³. In some embodiments, the at least one spacer includes a density of 150 kg/m³ to 250 kg/m³. In some embodiments, the at least one spacer includes a density of 150 kg/m³ to 200 kg/m³.

In some embodiments, the at least one spacer includes a density of 200 kg/m³ to 1,000 kg/m³. In some embodiments, the at least one spacer includes a density of 200 kg/m³ to 950 kg/m³. In some embodiments, the at least one spacer includes a density of 200 kg/m³ to 900 kg/m³. In some embodiments, the at least one spacer includes a density of 200 kg/m³ to 850 kg/m³. In some embodiments, the at least one spacer includes a density of 200 kg/m³ to 800 kg/m³. In some embodiments, the at least one spacer includes a density of 200 kg/m³ to 750 kg/m³. In some embodiments, the at least one spacer includes a density of 200 kg/m³ to 700 kg/m³. In some embodiments, the at least one spacer includes a density of 200 kg/m³ to 650 kg/m³. In some embodiments, the at least one spacer includes a density of 200 kg/m³ to 600 kg/m³. In some embodiments, the at least one spacer includes a density of 200 kg/m³ to 550 kg/m³. In some embodiments, the at least one spacer includes a density of 200 kg/m³ to 500 kg/m³. In some embodiments, the at least one spacer includes a density of 200 kg/m³ to 450 kg/m³. In some embodiments, the at least one spacer includes a density of 200 kg/m³ to 400 kg/m³. In some embodiments, the at least one spacer includes a density of 200 kg/m³ to 350 kg/m³. In some embodiments, the at least one spacer includes a density of 200 kg/m³ to 300 kg/m³. In some embodiments, the at least one spacer includes a density of 200 kg/m³ to 250 kg/m³.

In some embodiments, the at least one spacer includes a density of 250 kg/m³ to 1,000 kg/m³. In some embodiments, the at least one spacer includes a density of 250 kg/m³ to 950 kg/m³. In some embodiments, the at least one spacer includes a density of 250 kg/m³ to 900 kg/m³. In some embodiments, the at least one spacer includes a density of 250 kg/m³ to 850 kg/m³. In some embodiments, the at least one spacer includes a density of 250 kg/m³ to 800 kg/m³. In some embodiments, the at least one spacer includes a density of 250 kg/m³ to 750 kg/m³. In some embodiments, the at least one spacer includes a density of 250 kg/m³ to 700 kg/m³. In some embodiments, the at least one spacer includes a density of 250 kg/m³ to 650 kg/m³. In some embodiments, the at least one spacer includes a density of 250 kg/m³ to 600 kg/m³. In some embodiments, the at least one spacer includes a density of 250 kg/m³ to 550 kg/m³. In some embodiments, the at least one spacer includes a density of 250 kg/m³ to 500 kg/m³. In some embodiments, the at least one spacer includes a density of 250 kg/m³ to 450 kg/m³. In some embodiments, the at least one spacer includes a density of 250 kg/m³ to 400 kg/m³. In some embodiments, the at least one spacer includes a density of 250 kg/m³ to 350 kg/m³. In some embodiments, the at least one spacer includes a density of 250 kg/m³ to 300 kg/m³.

In some embodiments, the at least one spacer includes a density of 300 kg/m³ to 1,000 kg/m³. In some embodiments, the at least one spacer includes a density of 300 kg/m³ to 950 kg/m³. In some embodiments, the at least one spacer includes a density of 300 kg/m³ to 900 kg/m³. In some embodiments, the at least one spacer includes a density of 300 kg/m³ to 850 kg/m³. In some embodiments, the at least one spacer includes a density of 300 kg/m³ to 800 kg/m³. In some embodiments, the at least one spacer includes a density of 300 kg/m³ to 750 kg/m³. In some embodiments, the at least one spacer includes a density of 300 kg/m³ to 700 kg/m³. In some embodiments, the at least one spacer includes a density of 300 kg/m³ to 650 kg/m³. In some embodiments, the at least one spacer includes a density of 300 kg/m³ to 600 kg/m³. In some embodiments, the at least one spacer includes a density of 300 kg/m³ to 550 kg/m³. In some embodiments, the at least one spacer includes a density of 300 kg/m³ to 500 kg/m³. In some embodiments, the at least one spacer includes a density of 300 kg/m³ to 450 kg/m³. In some embodiments, the at least one spacer includes a density of 300 kg/m³ to 400 kg/m³. In some embodiments, the at least one spacer includes a density of 300 kg/m³ to 350 kg/m³.

In some embodiments, the at least one spacer includes a density of 350 kg/m³ to 1,000 kg/m³. In some embodiments, the at least one spacer includes a density of 350 kg/m³ to 950 kg/m³. In some embodiments, the at least one spacer includes a density of 350 kg/m³ to 900 kg/m³. In some embodiments, the at least one spacer includes a density of 350 kg/m³ to 850 kg/m³. In some embodiments, the at least one spacer includes a density of 350 kg/m³ to 800 kg/m³. In some embodiments, the at least one spacer includes a density of 350 kg/m³ to 750 kg/m³. In some embodiments, the at least one spacer includes a density of 350 kg/m³ to 700 kg/m³. In some embodiments, the at least one spacer includes a density of 350 kg/m³ to 650 kg/m³. In some embodiments, the at least one spacer includes a density of 350 kg/m³ to 600 kg/m³. In some embodiments, the at least one spacer includes a density of 350 kg/m³ to 550 kg/m³. In some embodiments, the at least one spacer includes a density of 350 kg/m³ to 500 kg/m³. In some embodiments, the at least one spacer includes a density of 350 kg/m³ to 450 kg/m³. In some embodiments, the at least one spacer includes a density of 350 kg/m³ to 400 kg/m³.

In some embodiments, the at least one spacer includes a density of 400 kg/m³ to 1,000 kg/m³. In some embodiments, the at least one spacer includes a density of 400 kg/m³ to 950 kg/m³. In some embodiments, the at least one spacer includes a density of 400 kg/m³ to 900 kg/m³. In some embodiments, the at least one spacer includes a density of 400 kg/m³ to 850 kg/m³. In some embodiments, the at least one spacer includes a density of 400 kg/m³ to 800 kg/m³. In some embodiments, the at least one spacer includes a density of 400 kg/m³ to 750 kg/m³. In some embodiments, the at least one spacer includes a density of 400 kg/m³ to 700 kg/m³. In some embodiments, the at least one spacer includes a density of 400 kg/m³ to 650 kg/m³. In some embodiments, the at least one spacer includes a density of 400 kg/m³ to 600 kg/m³. In some embodiments, the at least one spacer includes a density of 400 kg/m³ to 550 kg/m³. In some embodiments, the at least one spacer includes a density of 400 kg/m³ to 500 kg/m³. In some embodiments, the at least one spacer includes a density of 400 kg/m³ to 450 kg/m³.

In some embodiments, the at least one spacer includes a density of 450 kg/m³ to 1,000 kg/m³. In some embodiments, the at least one spacer includes a density of 450 kg/m³ to 950 kg/m³. In some embodiments, the at least one spacer includes a density of 450 kg/m³ to 900 kg/m³. In some embodiments, the at least one spacer includes a density of 450 kg/m³ to 850 kg/m³. In some embodiments, the at least one spacer includes a density of 450 kg/m³ to 800 kg/m³. In some embodiments, the at least one spacer includes a density of 450 kg/m³ to 750 kg/m³. In some embodiments, the at least one spacer includes a density of 450 kg/m³ to 700 kg/m³. In some embodiments, the at least one spacer includes a density of 450 kg/m³ to 650 kg/m³. In some embodiments, the at least one spacer includes a density of 450 kg/m³ to 600 kg/m³. In some embodiments, the at least one spacer includes a density of 450 kg/m³ to 550 kg/m³. In some embodiments, the at least one spacer includes a density of 450 kg/m³ to 500 kg/m³.

In some embodiments, the at least one spacer includes a density of 500 kg/m³ to 1,000 kg/m³. In some embodiments, the at least one spacer includes a density of 500 kg/m³ to 950 kg/m³. In some embodiments, the at least one spacer includes a density of 500 kg/m³ to 900 kg/m³. In some embodiments, the at least one spacer includes a density of 500 kg/m³ to 850 kg/m³. In some embodiments, the at least one spacer includes a density of 500 kg/m³ to 800 kg/m³. In some embodiments, the at least one spacer includes a density of 500 kg/m³ to 750 kg/m³. In some embodiments, the at least one spacer includes a density of 500 kg/m³ to 700 kg/m³. In some embodiments, the at least one spacer includes a density of 500 kg/m³ to 650 kg/m³. In some embodiments, the at least one spacer includes a density of 500 kg/m³ to 600 kg/m³. In some embodiments, the at least one spacer includes a density of 500 kg/m³ to 550 kg/m³.

In some embodiments, the at least one spacer includes a density of 550 kg/m³ to 1,000 kg/m³. In some embodiments, the at least one spacer includes a density of 550 kg/m³ to 950 kg/m³. In some embodiments, the at least one spacer includes a density of 550 kg/m³ to 900 kg/m³. In some embodiments, the at least one spacer includes a density of 550 kg/m³ to 850 kg/m³. In some embodiments, the at least one spacer includes a density of 550 kg/m³ to 800 kg/m³. In some embodiments, the at least one spacer includes a density of 550 kg/m³ to 750 kg/m³. In some embodiments, the at least one spacer includes a density of 550 kg/m³ to 700 kg/m³. In some embodiments, the at least one spacer includes a density of 550 kg/m³ to 650 kg/m³. In some embodiments, the at least one spacer includes a density of 550 kg/m³ to 600 kg/m³.

In some embodiments, the at least one spacer includes a density of 600 kg/m³ to 1,000 kg/m³. In some embodiments, the at least one spacer includes a density of 600 kg/m³ to 950 kg/m³. In some embodiments, the at least one spacer includes a density of 600 kg/m³ to 900 kg/m³. In some embodiments, the at least one spacer includes a density of 600 kg/m³ to 850 kg/m³. In some embodiments, the at least one spacer includes a density of 600 kg/m³ to 800 kg/m³. In some embodiments, the at least one spacer includes a density of 600 kg/m³ to 750 kg/m³. In some embodiments, the at least one spacer includes a density of 600 kg/m³ to 700 kg/m³. In some embodiments, the at least one spacer includes a density of 600 kg/m³ to 650 kg/m³.

In some embodiments, the at least one spacer includes a density of 650 kg/m³ to 1,000 kg/m³. In some embodiments, the at least one spacer includes a density of 650 kg/m³ to 950 kg/m³. In some embodiments, the at least one spacer includes a density of 650 kg/m³ to 900 kg/m³. In some embodiments, the at least one spacer includes a density of 650 kg/m³ to 850 kg/m³. In some embodiments, the at least one spacer includes a density of 650 kg/m³ to 800 kg/m³. In some embodiments, the at least one spacer includes a density of 650 kg/m³ to 750 kg/m³. In some embodiments, the at least one spacer includes a density of 650 kg/m³ to 700 kg/m³.

In some embodiments, the at least one spacer includes a density of 700 kg/m³ to 1,000 kg/m³. In some embodiments, the at least one spacer includes a density of 700 kg/m³ to 950 kg/m³. In some embodiments, the at least one spacer includes a density of 700 kg/m³ to 900 kg/m³. In some embodiments, the at least one spacer includes a density of 700 kg/m³ to 850 kg/m³. In some embodiments, the at least one spacer includes a density of 700 kg/m³ to 800 kg/m³. In some embodiments, the at least one spacer includes a density of 700 kg/m³ to 750 kg/m³.

In some embodiments, the at least one spacer includes a density of 750 kg/m³ to 1,000 kg/m³. In some embodiments, the at least one spacer includes a density of 750 kg/m³ to 950 kg/m³. In some embodiments, the at least one spacer includes a density of 750 kg/m³ to 900 kg/m³. In some embodiments, the at least one spacer includes a density of 750 kg/m³ to 850 kg/m³. In some embodiments, the at least one spacer includes a density of 750 kg/m³ to 800 kg/m³.

In some embodiments, the at least one spacer includes a density of 800 kg/m³ to 1,000 kg/m³. In some embodiments, the at least one spacer includes a density of 800 kg/m³ to 950 kg/m³. In some embodiments, the at least one spacer includes a density of 800 kg/m³ to 900 kg/m³. In some embodiments, the at least one spacer includes a density of 800 kg/m³ to 850 kg/m³.

In some embodiments, the at least one spacer includes a density of 850 kg/m³ to 1,000 kg/m³. In some embodiments, the at least one spacer includes a density of 850 kg/m³ to 950 kg/m³. In some embodiments, the at least one spacer includes a density of 850 kg/m³ to 900 kg/m³.

In some embodiments, the at least one spacer includes a density of 900 kg/m³ to 1,000 kg/m³. In some embodiments, the at least one spacer includes a density of 900 kg/m³ to 950 kg/m³. In some embodiments, the at least one spacer includes a density of 950 kg/m³ to 1,000 kg/m³.

In some embodiments, the at least one spacer includes a crush strength of 29 psi to 200 psi. In some embodiments, the at least one spacer includes a crush strength of 29 psi to 190 psi. In some embodiments, the at least one spacer includes a crush strength of 29 psi to 180 psi. In some embodiments, the at least one spacer includes a crush strength of 29 psi to 170 psi. In some embodiments, the at least one spacer includes a crush strength of 29 psi to 160 psi. In some embodiments, the at least one spacer includes a crush strength of 29 psi to 150 psi. In some embodiments, the at least one spacer includes a crush strength of 29 psi to 140 psi. In some embodiments, the at least one spacer includes a crush strength of 29 psi to 130 psi. In some embodiments, the at least one spacer includes a crush strength of 29 psi to 120 psi. In some embodiments, the at least one spacer includes a crush strength of 29 psi to 110 psi. In some embodiments, the at least one spacer includes a crush strength of 29 psi to 100 psi. In some embodiments, the at least one spacer includes a crush strength of 29 psi to 90 psi. In some embodiments, the at least one spacer includes a crush strength of 29 psi to 80 psi. In some embodiments, the at least one spacer includes a crush strength of 29 psi to 70 psi. In some embodiments, the at least one spacer includes a crush strength of 29 psi to 60 psi. In some embodiments, the at least one spacer includes a crush strength of 29 psi to 50 psi. In some embodiments, the at least one spacer includes a crush strength of 29 psi to 40 psi. In some embodiments, the at least one spacer includes a crush strength of 29 psi to 30 psi.

In some embodiments, the at least one spacer includes a crush strength of 30 psi to 200 psi. In some embodiments, the at least one spacer includes a crush strength of 30 psi to 190 psi. In some embodiments, the at least one spacer includes a crush strength of 30 psi to 180 psi. In some embodiments, the at least one spacer includes a crush strength of 30 psi to 170 psi. In some embodiments, the at least one spacer includes a crush strength of 30 psi to 160 psi. In some embodiments, the at least one spacer includes a crush strength of 30 psi to 150 psi. In some embodiments, the at least one spacer includes a crush strength of 30 psi to 140 psi. In some embodiments, the at least one spacer includes a crush strength of 30 psi to 130 psi. In some embodiments, the at least one spacer includes a crush strength of 30 psi to 120 psi. In some embodiments, the at least one spacer includes a crush strength of 30 psi to 110 psi. In some embodiments, the at least one spacer includes a crush strength of 30 psi to 100 psi. In some embodiments, the at least one spacer includes a crush strength of 30 psi to 90 psi. In some embodiments, the at least one spacer includes a crush strength of 30 psi to 80 psi. In some embodiments, the at least one spacer includes a crush strength of 30 psi to 70 psi. In some embodiments, the at least one spacer includes a crush strength of 30 psi to 60 psi. In some embodiments, the at least one spacer includes a crush strength of 30 psi to 50 psi. In some embodiments, the at least one spacer includes a crush strength of 30 psi to 40 psi.

In some embodiments, the at least one spacer includes a crush strength of 40 psi to 200 psi. In some embodiments, the at least one spacer includes a crush strength of 40 psi to 190 psi. In some embodiments, the at least one spacer includes a crush strength of 40 psi to 180 psi. In some embodiments, the at least one spacer includes a crush strength of 40 psi to 170 psi. In some embodiments, the at least one spacer includes a crush strength of 40 psi to 160 psi. In some embodiments, the at least one spacer includes a crush strength of 40 psi to 150 psi. In some embodiments, the at least one spacer includes a crush strength of 40 psi to 140 psi. In some embodiments, the at least one spacer includes a crush strength of 40 psi to 130 psi. In some embodiments, the at least one spacer includes a crush strength of 40 psi to 120 psi. In some embodiments, the at least one spacer includes a crush strength of 40 psi to 110 psi. In some embodiments, the at least one spacer includes a crush strength of 40 psi to 100 psi. In some embodiments, the at least one spacer includes a crush strength of 40 psi to 90 psi. In some embodiments, the at least one spacer includes a crush strength of 40 psi to 80 psi. In some embodiments, the at least one spacer includes a crush strength of 40 psi to 70 psi. In some embodiments, the at least one spacer includes a crush strength of 40 psi to 60 psi. In some embodiments, the at least one spacer includes a crush strength of 40 psi to 50 psi.

In some embodiments, the at least one spacer includes a crush strength of 50 psi to 200 psi. In some embodiments, the at least one spacer includes a crush strength of 50 psi to 190 psi. In some embodiments, the at least one spacer includes a crush strength of 50 psi to 180 psi. In some embodiments, the at least one spacer includes a crush strength of 50 psi to 170 psi. In some embodiments, the at least one spacer includes a crush strength of 50 psi to 160 psi. In some embodiments, the at least one spacer includes a crush strength of 50 psi to 150 psi. In some embodiments, the at least one spacer includes a crush strength of 50 psi to 140 psi. In some embodiments, the at least one spacer includes a crush strength of 50 psi to 130 psi. In some embodiments, the at least one spacer includes a crush strength of 50 psi to 120 psi. In some embodiments, the at least one spacer includes a crush strength of 50 psi to 110 psi. In some embodiments, the at least one spacer includes a crush strength of 50 psi to 100 psi. In some embodiments, the at least one spacer includes a crush strength of 50 psi to 90 psi. In some embodiments, the at least one spacer includes a crush strength of 50 psi to 80 psi. In some embodiments, the at least one spacer includes a crush strength of 50 psi to 70 psi. In some embodiments, the at least one spacer includes a crush strength of 50 psi to 60 psi.

In some embodiments, the at least one spacer includes a crush strength of 60 psi to 200 psi. In some embodiments, the at least one spacer includes a crush strength of 60 psi to 190 psi. In some embodiments, the at least one spacer includes a crush strength of 60 psi to 180 psi. In some embodiments, the at least one spacer includes a crush strength of 60 psi to 170 psi. In some embodiments, the at least one spacer includes a crush strength of 60 psi to 160 psi. In some embodiments, the at least one spacer includes a crush strength of 60 psi to 150 psi. In some embodiments, the at least one spacer includes a crush strength of 60 psi to 140 psi. In some embodiments, the at least one spacer includes a crush strength of 60 psi to 130 psi. In some embodiments, the at least one spacer includes a crush strength of 60 psi to 120 psi. In some embodiments, the at least one spacer includes a crush strength of 60 psi to 110 psi. In some embodiments, the at least one spacer includes a crush strength of 60 psi to 100 psi. In some embodiments, the at least one spacer includes a crush strength of 60 psi to 90 psi. In some embodiments, the at least one spacer includes a crush strength of 60 psi to 80 psi. In some embodiments, the at least one spacer includes a crush strength of 60 psi to 70 psi.

In some embodiments, the at least one spacer includes a crush strength of 70 psi to 200 psi. In some embodiments, the at least one spacer includes a crush strength of 70 psi to 190 psi. In some embodiments, the at least one spacer includes a crush strength of 70 psi to 180 psi. In some embodiments, the at least one spacer includes a crush strength of 70 psi to 170 psi. In some embodiments, the at least one spacer includes a crush strength of 70 psi to 160 psi. In some embodiments, the at least one spacer includes a crush strength of 70 psi to 150 psi. In some embodiments, the at least one spacer includes a crush strength of 70 psi to 140 psi. In some embodiments, the at least one spacer includes a crush strength of 70 psi to 130 psi. In some embodiments, the at least one spacer includes a crush strength of 70 psi to 120 psi. In some embodiments, the at least one spacer includes a crush strength of 70 psi to 110 psi. In some embodiments, the at least one spacer includes a crush strength of 70 psi to 100 psi. In some embodiments, the at least one spacer includes a crush strength of 70 psi to 90 psi. In some embodiments, the at least one spacer includes a crush strength of 70 psi to 80 psi.

In some embodiments, the at least one spacer includes a crush strength of 80 psi to 200 psi. In some embodiments, the at least one spacer includes a crush strength of 80 psi to 190 psi. In some embodiments, the at least one spacer includes a crush strength of 80 psi to 180 psi. In some embodiments, the at least one spacer includes a crush strength of 80 psi to 170 psi. In some embodiments, the at least one spacer includes a crush strength of 80 psi to 160 psi. In some embodiments, the at least one spacer includes a crush strength of 80 psi to 150 psi. In some embodiments, the at least one spacer includes a crush strength of 80 psi to 140 psi. In some embodiments, the at least one spacer includes a crush strength of 80 psi to 130 psi. In some embodiments, the at least one spacer includes a crush strength of 80 psi to 120 psi. In some embodiments, the at least one spacer includes a crush strength of 80 psi to 110 psi. In some embodiments, the at least one spacer includes a crush strength of 80 psi to 100 psi. In some embodiments, the at least one spacer includes a crush strength of 80 psi to 90 psi.

In some embodiments, the at least one spacer includes a crush strength of 90 psi to 200 psi. In some embodiments, the at least one spacer includes a crush strength of 90 psi to 190 psi. In some embodiments, the at least one spacer includes a crush strength of 90 psi to 180 psi. In some embodiments, the at least one spacer includes a crush strength of 90 psi to 170 psi. In some embodiments, the at least one spacer includes a crush strength of 90 psi to 160 psi. In some embodiments, the at least one spacer includes a crush strength of 90 psi to 150 psi. In some embodiments, the at least one spacer includes a crush strength of 90 psi to 140 psi. In some embodiments, the at least one spacer includes a crush strength of 90 psi to 130 psi. In some embodiments, the at least one spacer includes a crush strength of 90 psi to 120 psi. In some embodiments, the at least one spacer includes a crush strength of 90 psi to 110 psi. In some embodiments, the at least one spacer includes a crush strength of 90 psi to 100 psi.

In some embodiments, the at least one spacer includes a crush strength of 100 psi to 200 psi. In some embodiments, the at least one spacer includes a crush strength of 100 psi to 190 psi. In some embodiments, the at least one spacer includes a crush strength of 100 psi to 180 psi. In some embodiments, the at least one spacer includes a crush strength of 100 psi to 170 psi. In some embodiments, the at least one spacer includes a crush strength of 100 psi to 160 psi. In some embodiments, the at least one spacer includes a crush strength of 100 psi to 150 psi. In some embodiments, the at least one spacer includes a crush strength of 100 psi to 140 psi. In some embodiments, the at least one spacer includes a crush strength of 100 psi to 130 psi. In some embodiments, the at least one spacer includes a crush strength of 100 psi to 120 psi. In some embodiments, the at least one spacer includes a crush strength of 100 psi to 110 psi.

In some embodiments, the at least one spacer includes a crush strength of 110 psi to 200 psi. In some embodiments, the at least one spacer includes a crush strength of 110 psi to 190 psi. In some embodiments, the at least one spacer includes a crush strength of 110 psi to 180 psi. In some embodiments, the at least one spacer includes a crush strength of 110 psi to 170 psi. In some embodiments, the at least one spacer includes a crush strength of 110 psi to 160 psi. In some embodiments, the at least one spacer includes a crush strength of 110 psi to 150 psi. In some embodiments, the at least one spacer includes a crush strength of 110 psi to 140 psi. In some embodiments, the at least one spacer includes a crush strength of 110 psi to 130 psi. In some embodiments, the at least one spacer includes a crush strength of 110 psi to 120 psi.

In some embodiments, the at least one spacer includes a crush strength of 120 psi to 200 psi. In some embodiments, the at least one spacer includes a crush strength of 120 psi to 190 psi. In some embodiments, the at least one spacer includes a crush strength of 120 psi to 180 psi. In some embodiments, the at least one spacer includes a crush strength of 120 psi to 170 psi. In some embodiments, the at least one spacer includes a crush strength of 120 psi to 160 psi. In some embodiments, the at least one spacer includes a crush strength of 120 psi to 150 psi. In some embodiments, the at least one spacer includes a crush strength of 120 psi to 140 psi. In some embodiments, the at least one spacer includes a crush strength of 120 psi to 130 psi.

In some embodiments, the at least one spacer includes a crush strength of 130 psi to 200 psi. In some embodiments, the at least one spacer includes a crush strength of 130 psi to 190 psi. In some embodiments, the at least one spacer includes a crush strength of 130 psi to 180 psi. In some embodiments, the at least one spacer includes a crush strength of 130 psi to 170 psi. In some embodiments, the at least one spacer includes a crush strength of 130 psi to 160 psi. In some embodiments, the at least one spacer includes a crush strength of 130 psi to 150 psi. In some embodiments, the at least one spacer includes a crush strength of 130 psi to 140 psi.

In some embodiments, the at least one spacer includes a crush strength of 140 psi to 200 psi. In some embodiments, the at least one spacer includes a crush strength of 140 psi to 190 psi. In some embodiments, the at least one spacer includes a crush strength of 140 psi to 180 psi. In some embodiments, the at least one spacer includes a crush strength of 140 psi to 170 psi. In some embodiments, the at least one spacer includes a crush strength of 140 psi to 160 psi. In some embodiments, the at least one spacer includes a crush strength of 140 psi to 150 psi.

In some embodiments, the at least one spacer includes a crush strength of 150 psi to 200 psi. In some embodiments, the at least one spacer includes a crush strength of 150 psi to 190 psi. In some embodiments, the at least one spacer includes a crush strength of 150 psi to 180 psi. In some embodiments, the at least one spacer includes a crush strength of 150 psi to 170 psi. In some embodiments, the at least one spacer includes a crush strength of 150 psi to 160 psi.

In some embodiments, the at least one spacer includes a crush strength of 160 psi to 200 psi. In some embodiments, the at least one spacer includes a crush strength of 160 psi to 190 psi. In some embodiments, the at least one spacer includes a crush strength of 160 psi to 180 psi. In some embodiments, the at least one spacer includes a crush strength of 160 psi to 170 psi.

In some embodiments, the at least one spacer includes a crush strength of 170 psi to 200 psi. In some embodiments, the at least one spacer includes a crush strength of 170 psi to 190 psi. In some embodiments, the at least one spacer includes a crush strength of 170 psi to 180 psi.

In some embodiments, the at least one spacer includes a crush strength of 180 psi to 200 psi. In some embodiments, the at least one spacer includes a crush strength of 180 psi to 190 psi. In some embodiments, the at least one spacer includes a crush strength of 190 psi to 200 psi.

As used herein, the term "crush strength" means the greatest compressive strength that a solid material can sustain without irreversible deformation.

In some embodiments, at least one spacer underlying a PV module is sufficiently configured (e.g., sized, shaped, positioned, made using a suitable material, etc.) such that the at least one spacer provides a suitable damping. In some embodiments, a PV system is critically damped or underdamped in order to minimize the magnitude of the force seen at contact.

Figure 2A:
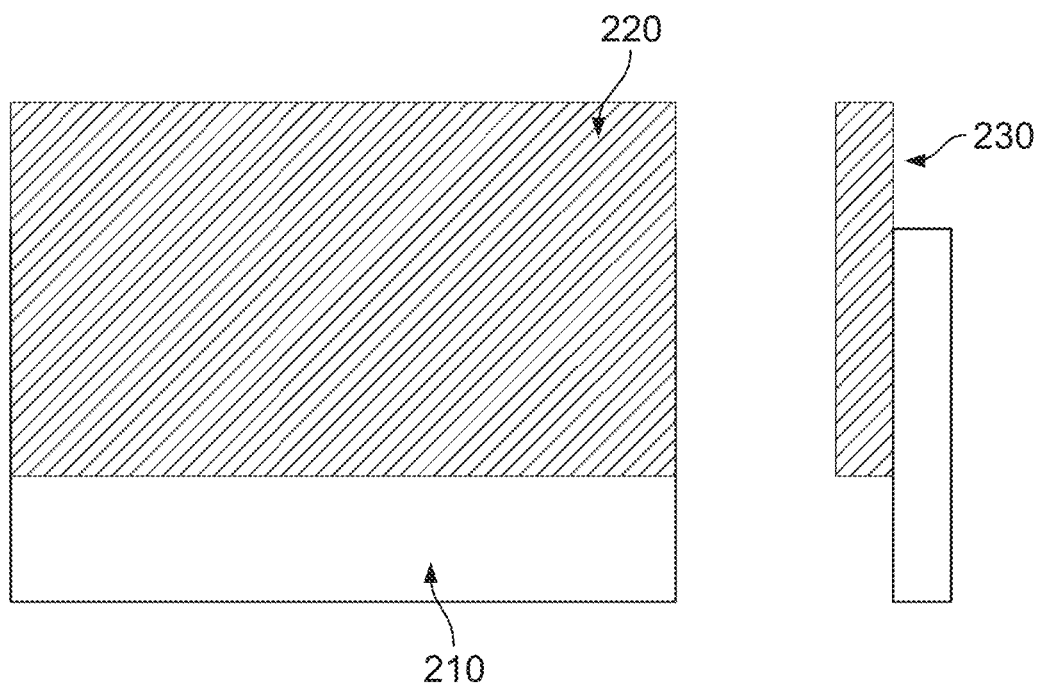
FIG. 2A shows a front view and a side view of an exemplary embodiment of a PV module and a spacer.
Figure 2B:
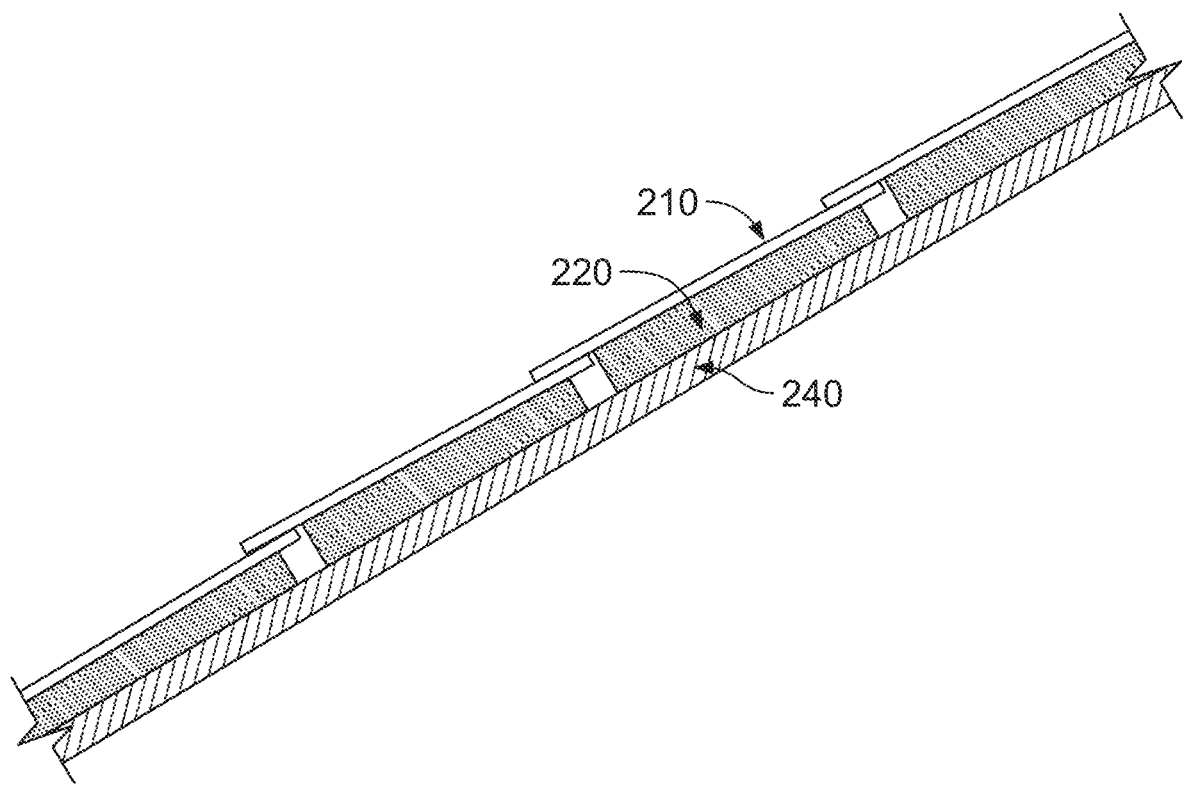
FIG. 2B shows a side view of the exemplary embodiment of a PV module and a spacer of FIG. 2A as installed on a representative roof deck.

In some embodiments, a spacer is spread over the entire backing of flexible modules to provide support under larger impacts, as shown in FIGS. 1A, 2A, and 2B. In some embodiments, one or more spacers are attached to the rear surface of a PV module (i.e., the surface that faces toward the roof and away from the sun when the module is installed). In some embodiments, a single spacer covers a large portion (e.g., more than 25% of, or more than 50% of, or more than 75% of) the rear surface of a PV module. In an embodiment, a single spacer covers the entirety of the rear surface of a PV module. FIG. 1A shows front and side views of an embodiment of a PV module 110 and a spacer 120 covering a large portion of the rear surface thereof. In some embodiments, a profile of a spacer is contained entirely within a profile of a corresponding PV module. In some embodiments, such as shown in FIG. 1A, a profile of a spacer 120 extends outwardly and beyond a profile of a corresponding one of the PV module 110. FIG. 2A shows front and side views of an embodiment of a PV module 210, a spacer 220 covering a large portion of the rear surface thereof, and a nailing strip 230 that is configured to facilitate nailing of the PV module 210 to an underlying roof deck 240.

Figure 1B:
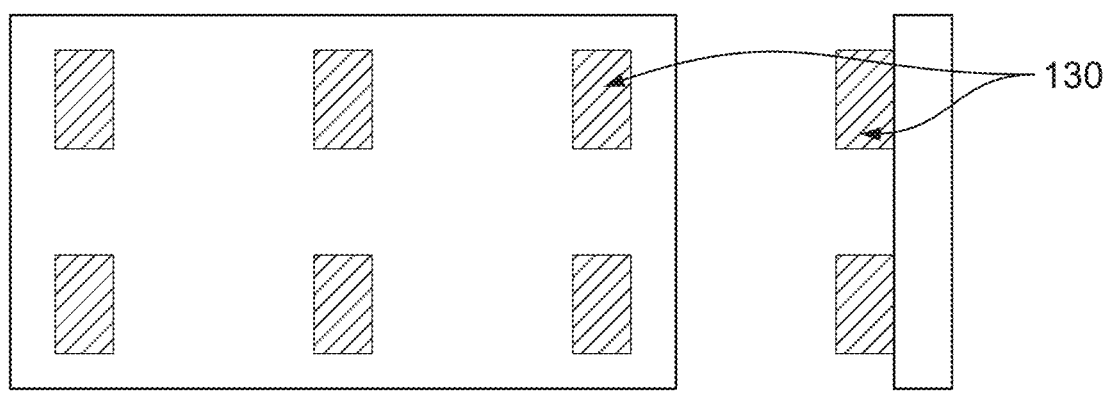
FIG. 1B shows a front view and a side view of an exemplary embodiment of a PV module and a spacer.
Figure 1C:
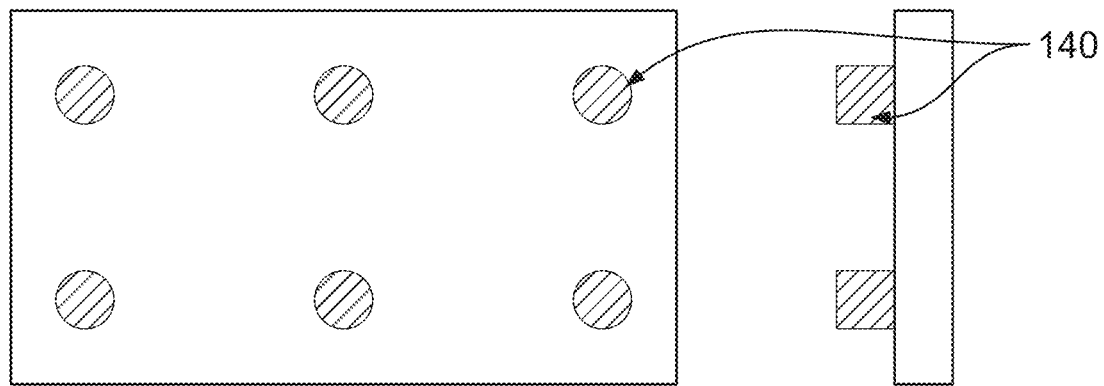
FIG. 1C shows a front view and a side view of an exemplary embodiment of a PV module and a spacer.
Figure 1D:
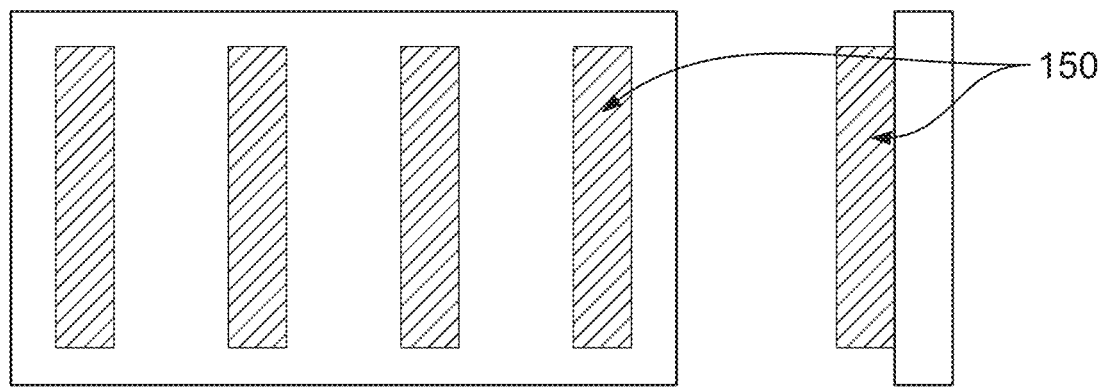
FIG. 1D shows a front view and a side view of an exemplary embodiment of a PV module and a spacer.

In some embodiments, spacers are provided in discrete portions to allow for minimal material so that impact forces can be minimized, as shown in FIGS. 1B through 1D. FIG. 1B shows front and side views of a first embodiment of a PV module 110 and spacers 130 that are provided in discrete portions along a rear surface of the PV module 110. In the embodiment shown in FIG. 1B, the spacers 130 have a rectangular profile and are arrayed across the rear surface of the PV module 110 in a grid-like array. FIG. 1C shows front and side views of a second embodiment of a PV module 110 and spacers 140 that are provided in discrete portions along a rear surface of the PV module 110. In the embodiment shown in FIG. 1C, the spacers 140 have a circular profile and are arrayed across the rear surface of the PV module 110 in a grid-like array. FIG. 1D shows front and side views of a third embodiment of a PV module 110 and spacers 150 that are provided in discrete portions along a rear surface of the PV module 110. In the embodiment shown in FIG. 1D, the spacers 150 have an elongate profile and are arrayed across the rear surface of the PV module 110 in a linear array. In an embodiment, the spacers 140 include a square profile and are arrayed across the rear surface of the PV module 110 in a grid-like array. It will be apparent to those of skill in the art that the specific shapes and arrangements of spacers shown in FIGS. 1B-1D are only exemplary and that other shapes and arrangements of discrete spacers are possible without departing from the broader principles exemplified by the exemplary embodiments.

Figure 3A:
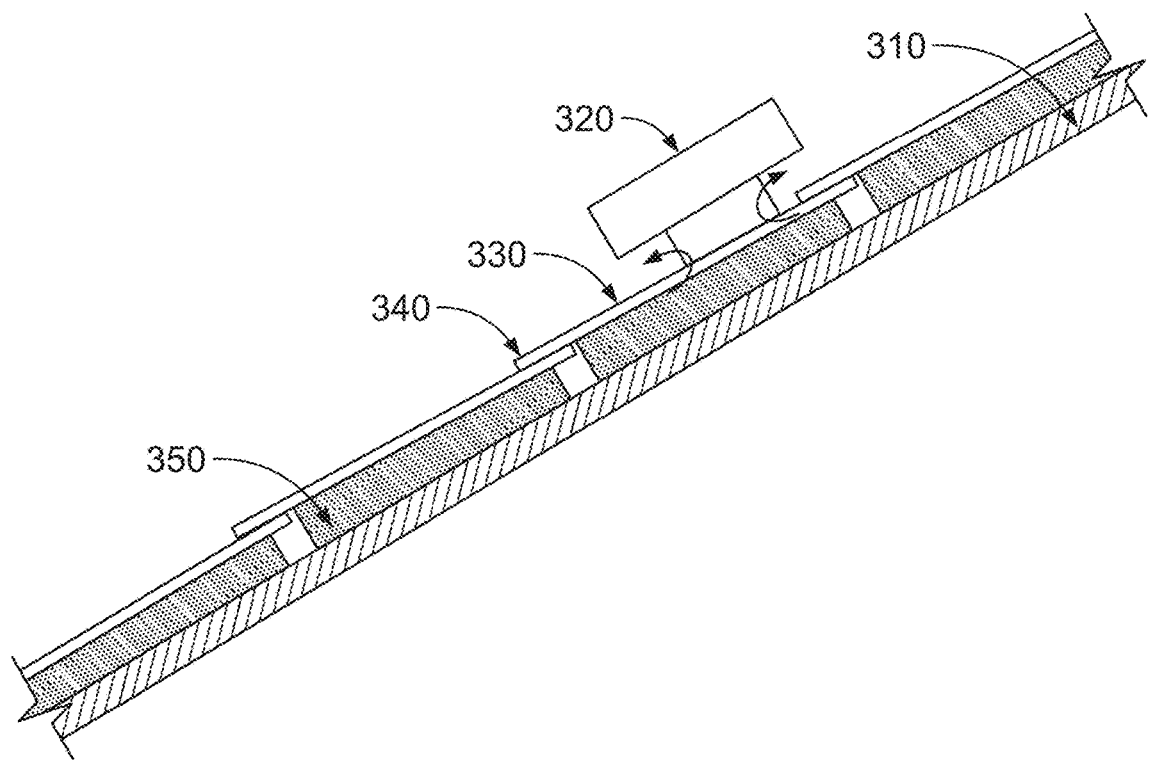
FIG. 3A shows a side view of an exemplary embodiment of a PV module, a spacer, and a fan.
Figure 3B:
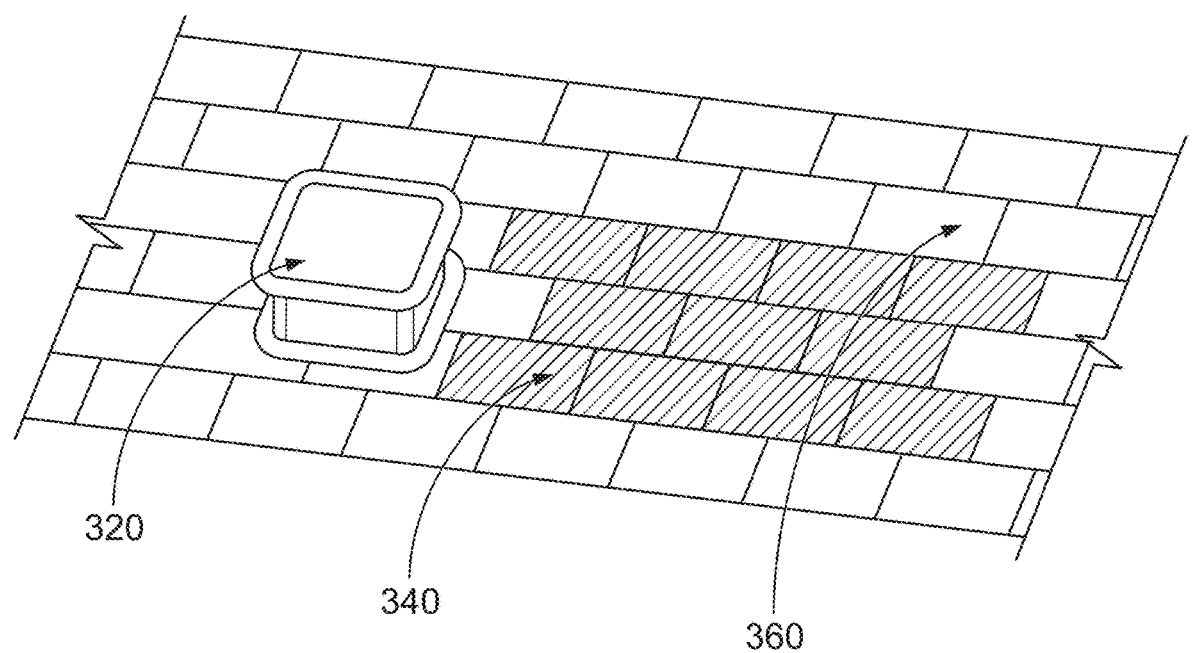
FIG. 3B shows a perspective view of the exemplary embodiment of FIG. 3A.

In some embodiments, in order to provide thermal management benefits, spacers are configured to allow air flow between a PV module and an underlying roof deck to which the PV module is mounted. In some embodiments, a spacer includes a porous medium in order to allow such air flow. In some embodiments, a spacer includes discrete solid media in order to allow such air flow. In some embodiments, one or more spacers are directly attached (e.g., using an adhesive) to a PV module. In some embodiments, one or more spacers are laid out as an underlayment. In some embodiments, a PV system including one or move PV modules also includes a ventilation fan configured to pull or push air through the cooling space. FIGS. 3A and 3B show a cross-sectional view and a perspective view, respectively, of elements of a PV system 300 attached to a roof deck 310. In some embodiments, the PV system includes a plurality of PV modules 340 which are separated from the roof deck 310 by spacers 350. In some embodiments, a fan 320 pulls air under the PV modules 340 and through the spacers 350 (e.g., through the body of spacers 350 that include a porous medium or between adjacent ones of the spacers 350 that include a solid medium) trapped by the roof deck 310. In some embodiments, the fan 320 exhausts this air to an external environment. In some embodiments, the spaces around the fan 320 may be covered by conventional shingles 360, which may be arranged to ensure a water shedding layer. In some embodiments, an overlap 330 between the fan 320 and either the PV modules 340 or the conventional shingles 360 is provided and prevents air leakage. In some embodiments, air intakes are located at each one of the PV modules 340. In some embodiments, air intakes are consolidated at one or more locations.

Figure 4A:
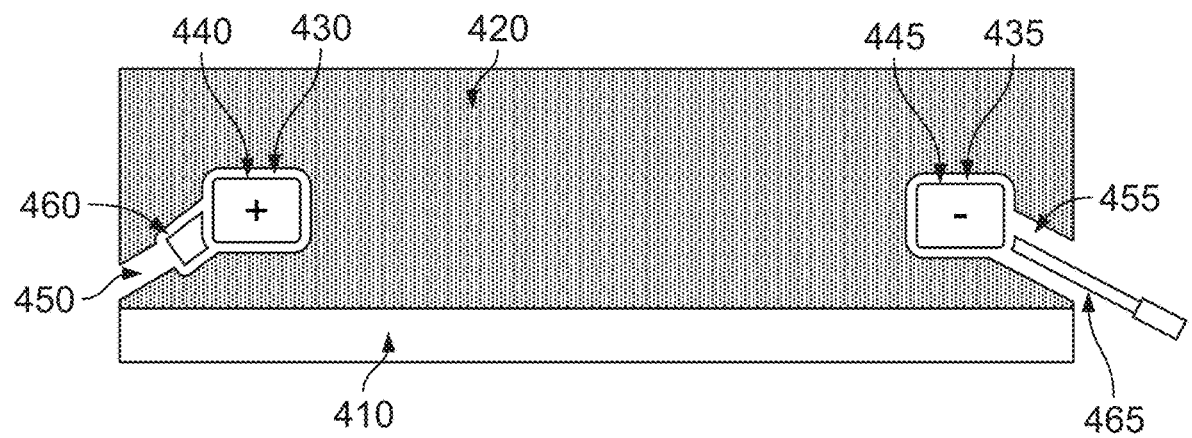
FIG. 4A shows a rear view of an exemplary embodiment of a PV module and a spacer that includes cutouts to accommodate electronic components of the PV module.
Figure 4B:
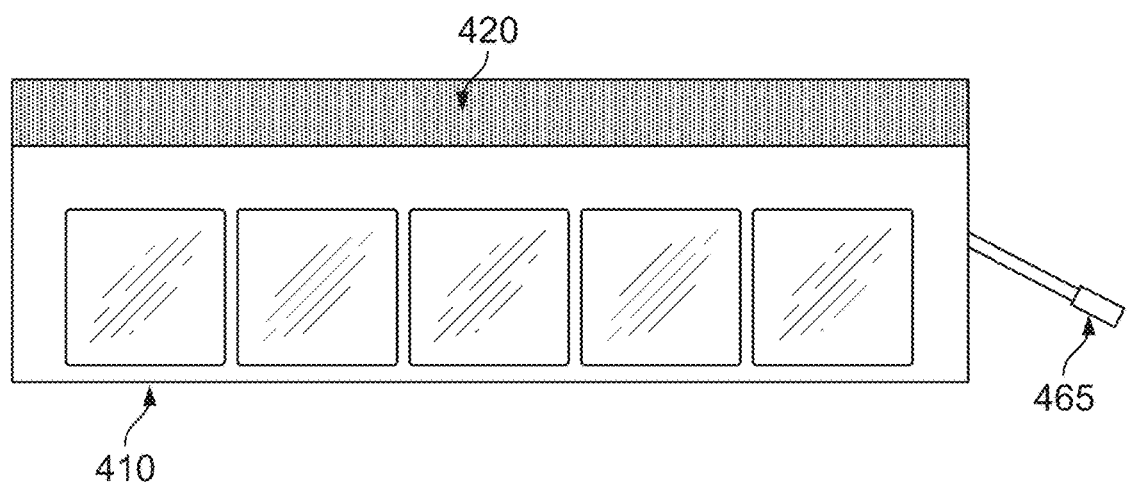
FIG. 4B shows a front view of the exemplary embodiment of FIG. 4A.

In some embodiments, a spacer is configured to surround or cover junction boxes to protect a front or rear mounted junction box from slow impacts (e.g., stepping) or fast impacts (e.g., hail or tool drops), as shown in FIGS. 4B-4E. In some embodiments, one or more spacers include at least one cut-out to accommodate junction boxes and/or wires. In some embodiments, the spacers include a fiber wool. In some embodiments, the spacers include a composite fiber wool. In some embodiments, the spacers include a composite fiber wool commercialized by GAF of Parsippany, N.J. under the trade name COBRA® EXHAUST VENT. FIGS. 4A-4E show several views of such embodiments. FIG. 4A shows a rear view of a PV module 410 and a spacer 420 including cut-outs. In some embodiments, a spacer 420 includes one or more cut-outs 430, 435 configured (e.g., sized and shaped) to accommodate respective junction boxes 440, 445. In some embodiments, a spacer includes one or more cut-outs 450, 455 configured (e.g., sized and shaped) to accommodate respective wires 460, 465. In some embodiments, the cut-outs 450, 455 are angled at 45 degrees with respect to the profile of the PV module 410. FIG. 4B shows a front view of the PV module 410 shown in FIG. 4A.

Figure 4C:
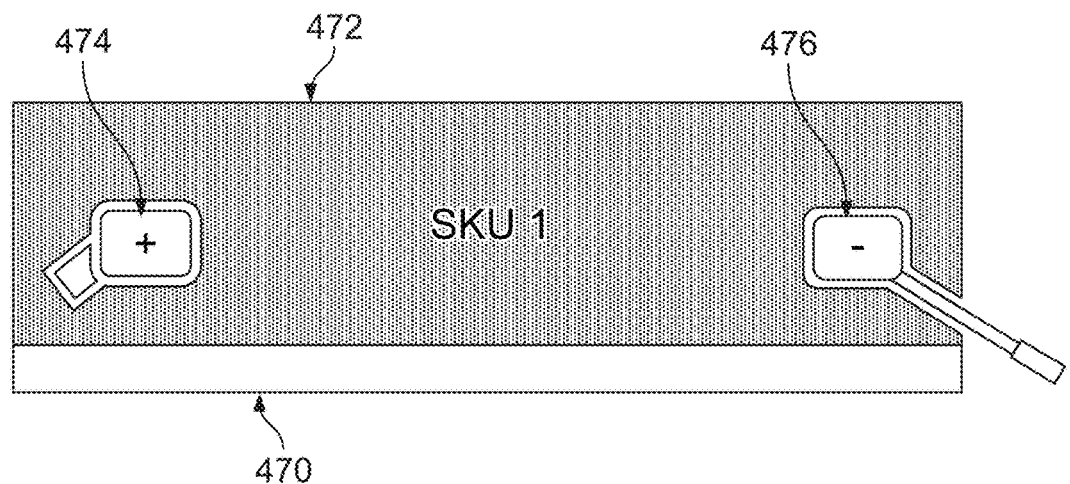
FIG. 4C shows a rear view of a first version of an exemplary embodiment of a PV module and a spacer that includes cutouts to accommodate electronic components of the PV module.
Figure 4D:
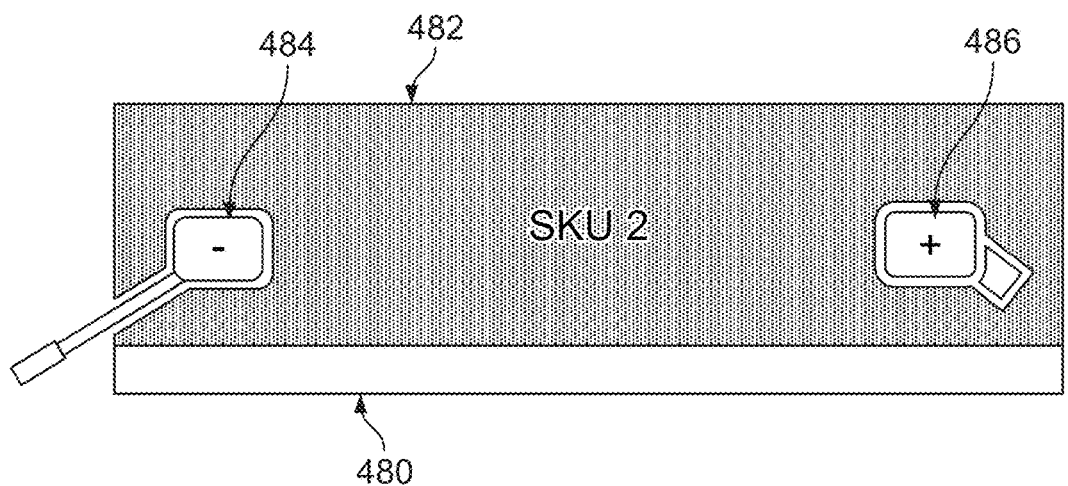
FIG. 4D shows a rear view of a second version of an exemplary embodiment of a PV module and a spacer that includes cutouts to accommodate electronic components of the PV module.
Figure 4E:
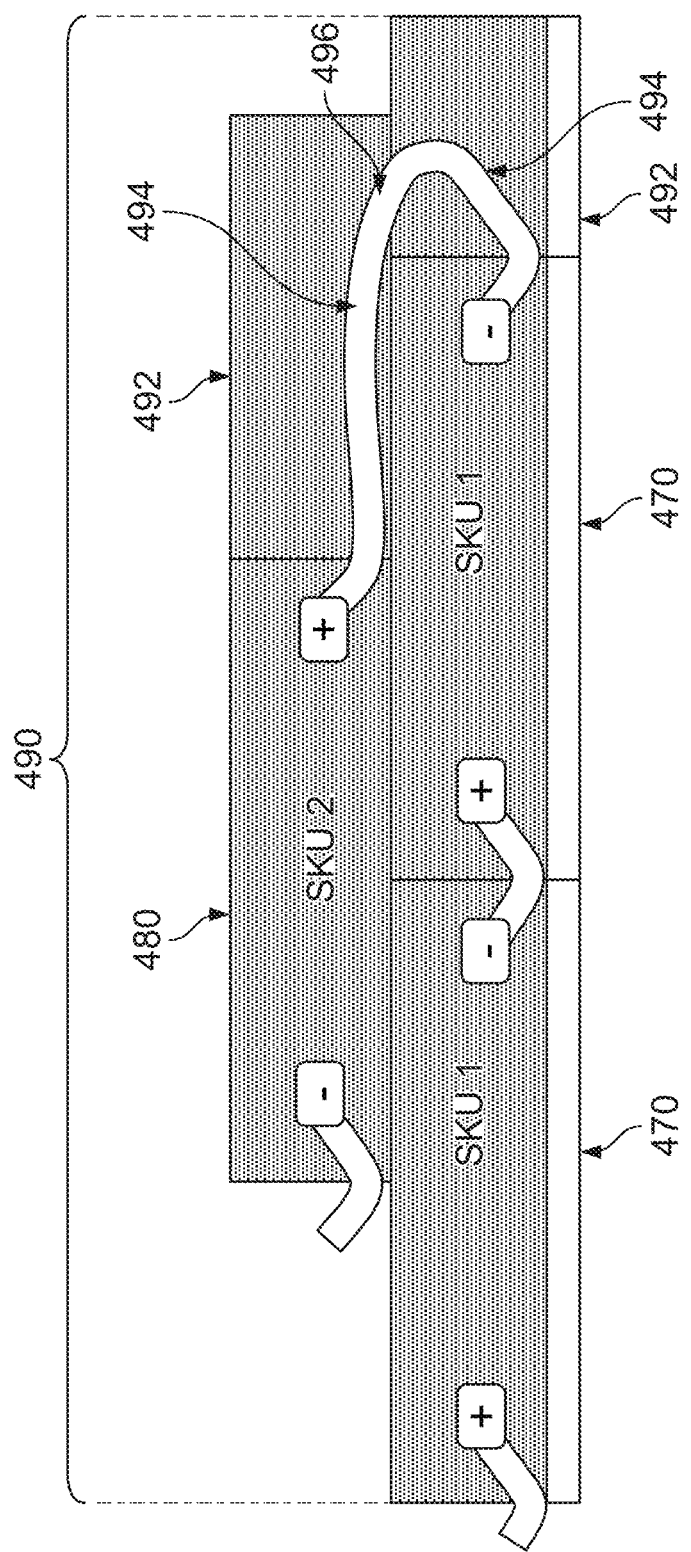
FIG. 4E shows a rear view of an exemplary system including the first version of FIG. 4C and the second version of FIG. 4D.

In some embodiments, PV modules with spacers including cut-outs to accommodate junction boxes and/or wires are provided in at least two different versions (e.g., under different stock-keeping unit, or "SKU" identifiers) to account for PV modules with junction boxes with different polarity in different positions (e.g., at different ends of the PV modules). FIG. 4C shows an embodiment of a first version (e.g., a first SKU) of a PV module 470 including a spacer 472 having cutouts for a positive junction box 474 at a first end (e.g., the left end of the PV module 470 when viewed from below) and a negative junction box 476 at a second end (e.g., the right end of the PV module when viewed from below). FIG. 4D shows an embodiment of a second version (e.g., a second SKU) of a PV module 480 including a spacer 482 having cutouts for a negative junction box 484 at a first end that is analogous to the first end of the PV module 470 and a positive junction box 486 at a second end that is analogous to the second end of the PV module 470. In other words, in some embodiments, when the PV module 470 and the PV module 480 are oriented identically to one another, as shown in FIGS. 4C and 4D, respectively, the positive junction boxes 474, 486 are located at opposite ends with respect to one another, and the negative junction boxes 476, 484 are also located at opposite ends with respect to one another. FIG. 4E shows portions of a PV system 490 incorporating the PV module 470 and the PV module 480. In some embodiments, the PV system 490 also includes one or more "faux tiles" 492, which do not include junction boxes, but include cutouts 494 to accommodate a cable 496 connecting the PV module 470 to the PV module 480.

Figure 5A:
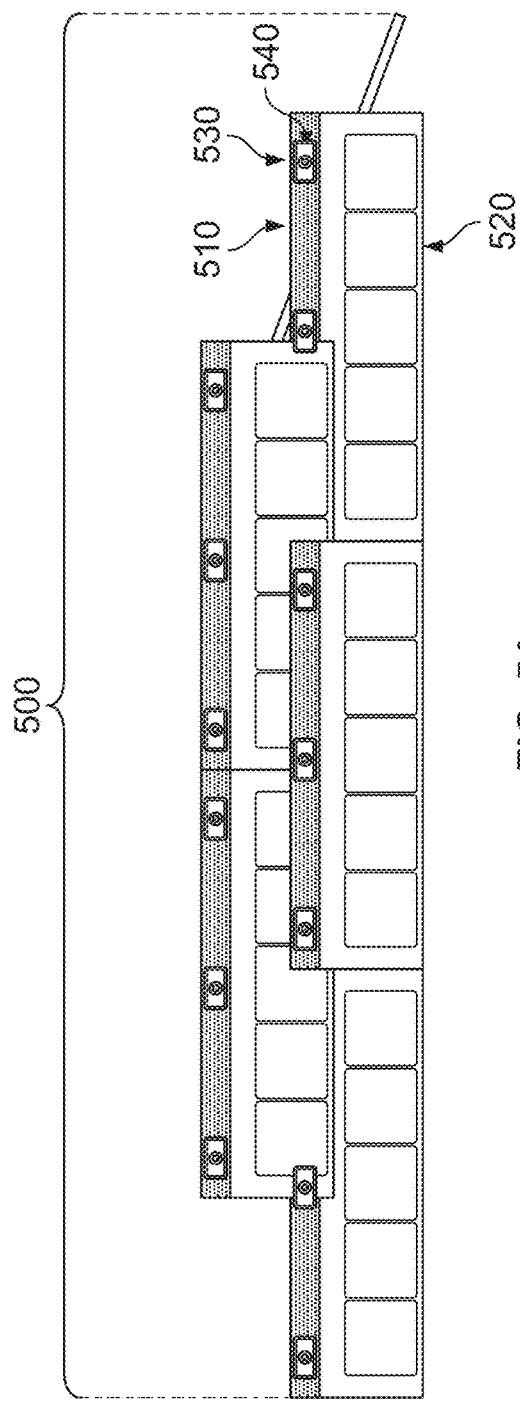
FIG. 5A shows a front view of an exemplary embodiment of an exemplary embodiment of a photovoltaic module and a spacer that includes nail plates.
Figure 5B:
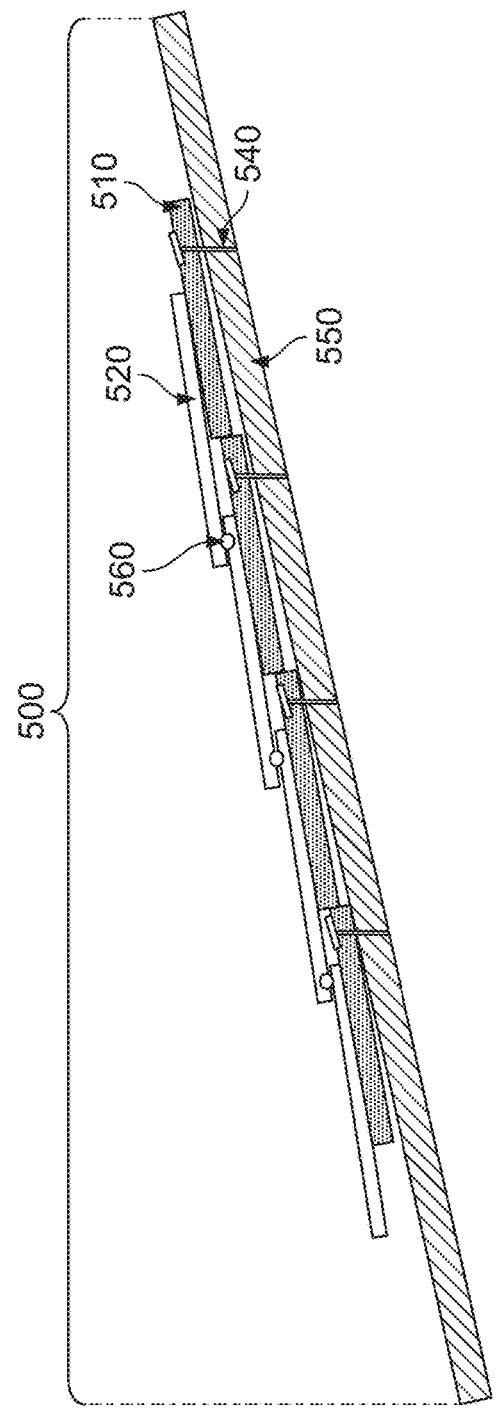
FIG. 5B shows a side view of the exemplary embodiment of FIG. 5A.

In some embodiments, a spacer includes one or more elements providing for fixation of the spacer to an underlying roof deck. In some embodiments, the one or more elements providing fixation include a nail plate. FIGS. 5A and 5B show a top view and side view, respectively, of a portion of a PV system 500 including such spacers. In some embodiments, a PV system 500 includes at least one spacer 510 underlying at least one PV module 520. In some embodiments, each one of the at least one spacer 510 underlays, and extends beyond the perimeter of, a corresponding one of the at least one PV modules 520. In some embodiments, each of the at least one spacer 510 includes a fiber wool. In some embodiments, each of the at least one spacer 510 includes a composite fiber wool. In some embodiments, each of the at least one spacer 510 includes a composite fiber wool commercialized by GAF of Parsippany, N.J. under the trade name COBRA® EXHAUST VENT. In some embodiments, each of the at least one spacer 510 includes at least one nail plate 530 positioned on a portion of the spacer that extends beyond a perimeter of the corresponding one of at least one PV module 520. In some embodiments, the at least one nail plate 530 is configured to receive a nail 540 that is suitable to attach the at least one spacer 510 and the corresponding one of the at least one PV module 520 to an underlying roof deck 550. In some embodiments, the PV system includes an adhesive strip 560 (e.g., a hot melt adhesive, a pressure-sensitive adhesive, etc.) that is positioned between adjacent ones of the at least one PV module 520 in order to provide shock absorption and uplift. In some embodiments, a watershedding layer (e.g., an underlayment) may be positioned between a spacer (e.g., the at least one spacer 510) and a roof deck (e.g., a wooden roof deck) so as to protect the roof deck from moisture.

In some embodiments, a spacer is configured to interface with one or more elements providing for fixation of the spacer to an underlying roof deck. In some embodiments, the one or more elements providing fixation include a hooking loop. FIGS. 6A and 6B show a top view and side view, respectively, of a portion of a PV system 600 including such spacers. In some embodiments, a PV system 600 includes at least one spacer 610 underlying at least one PV module 620. In some embodiments, each at least one spacer 610 underlays, and extends beyond the perimeter of, a corresponding one of the at least one PV module 620. In some embodiments, each of the at least one spacer 610 includes a fiber wool. In some embodiments, each of the at least one spacer 610 includes a composite fiber wool. In some embodiments, each of the at least one spacer 610 includes a composite fiber wool commercialized by GAF of Parsippany, N.J. under the trade name COBRA®

EXHAUST VENT. In some embodiments, at least one hooking loop 630 is attached to a roof deck 650. In some embodiments, the at least one hooking loop 630 includes hooks (e.g., of a type that is commonly included in hook-and-loop fasteners) that comprise a metal, a plastic, a fabric, or another suitable material, and which are configured to retain the at least one spacer 610 in place with respect to the roof deck 650. In some embodiments, the at least one hooking loop 630 is attached to the roof deck 650 by at least one nail. In some embodiments, the at least one hooking loop 630 is configured to engage (e.g., hook into) the at least one spacer 610 so as to retain the at least one spacer 610, and thereby a corresponding one of the at least one PV module 620, at a desired location on the roof deck 650. In some embodiments, the PV system includes an adhesive strip that is positioned between adjacent ones of the at least one PV module 620 in order to provide shock absorption and uplift.

Figure 7A:
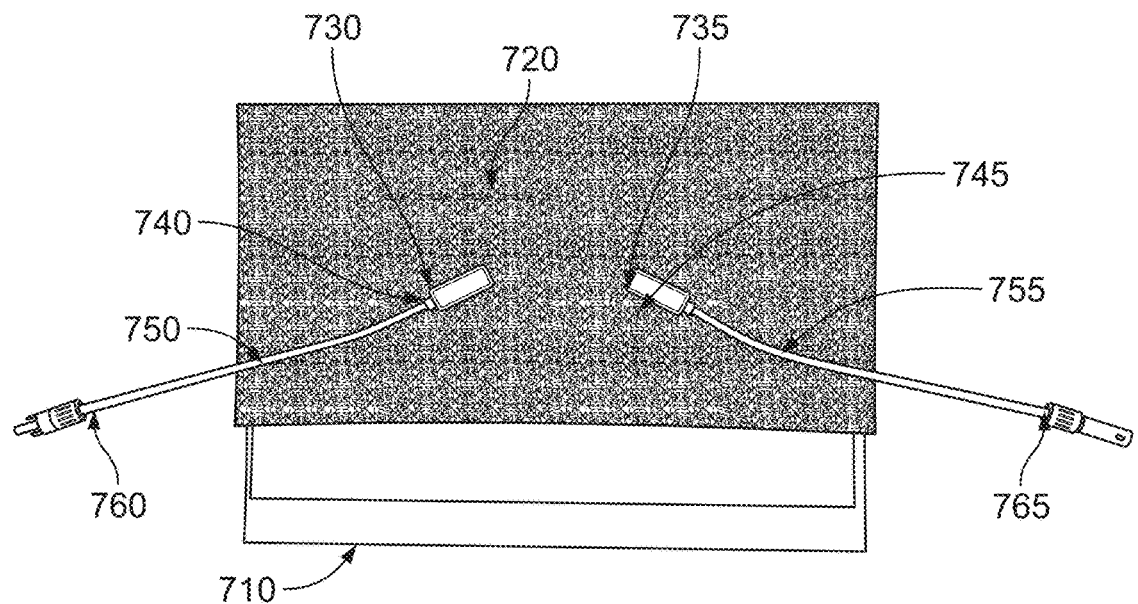
FIG. 7A shows a rear view of a prototype of an exemplary embodiment of a PV module and a spacer that includes cutouts to accommodate electronic components of the photovoltaic module.
Figure 7B:
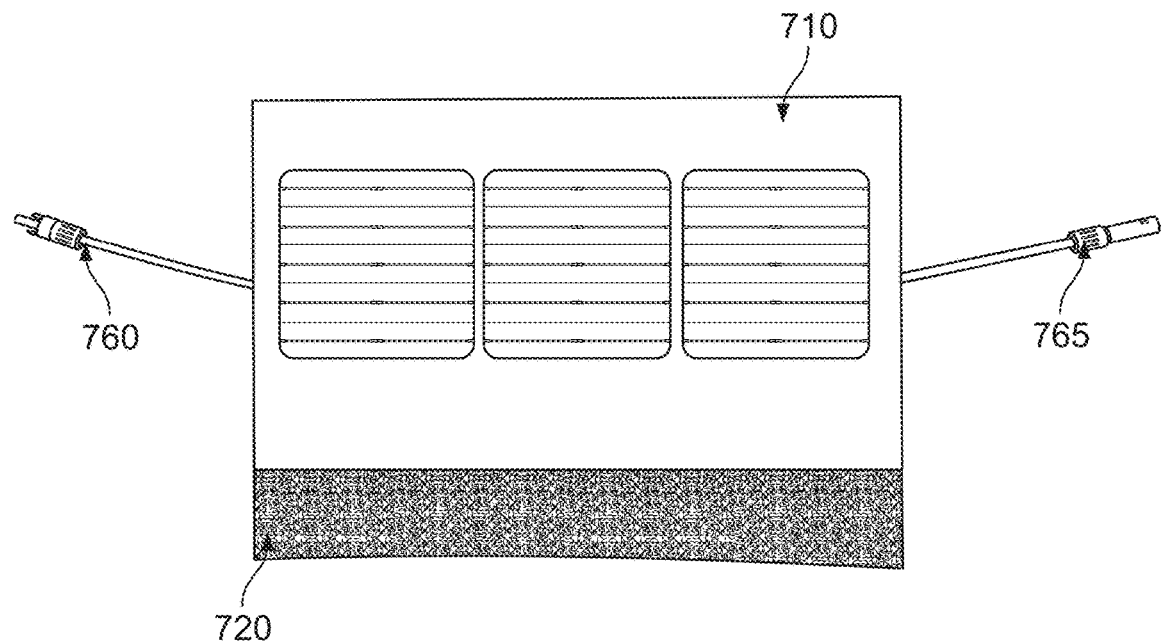
FIG. 7B shows a front view of the prototype of FIG. 7A.
Figure 7C:
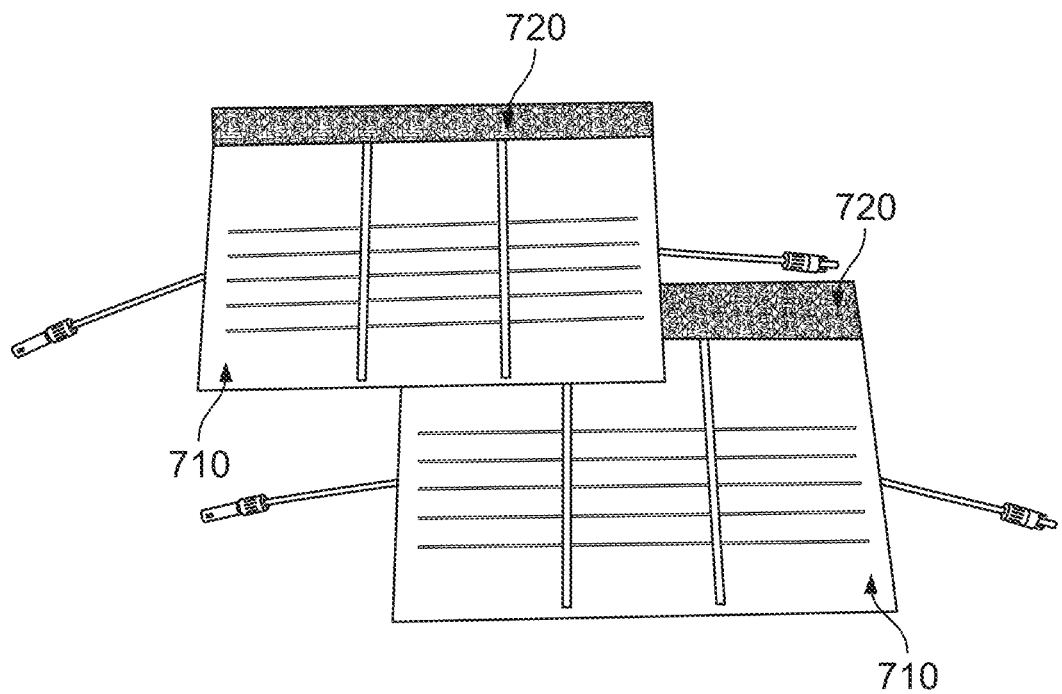
FIG. 7C shows a prototype of FIG. 7A as positioned on a first representative roof deck.
Figure 7D:
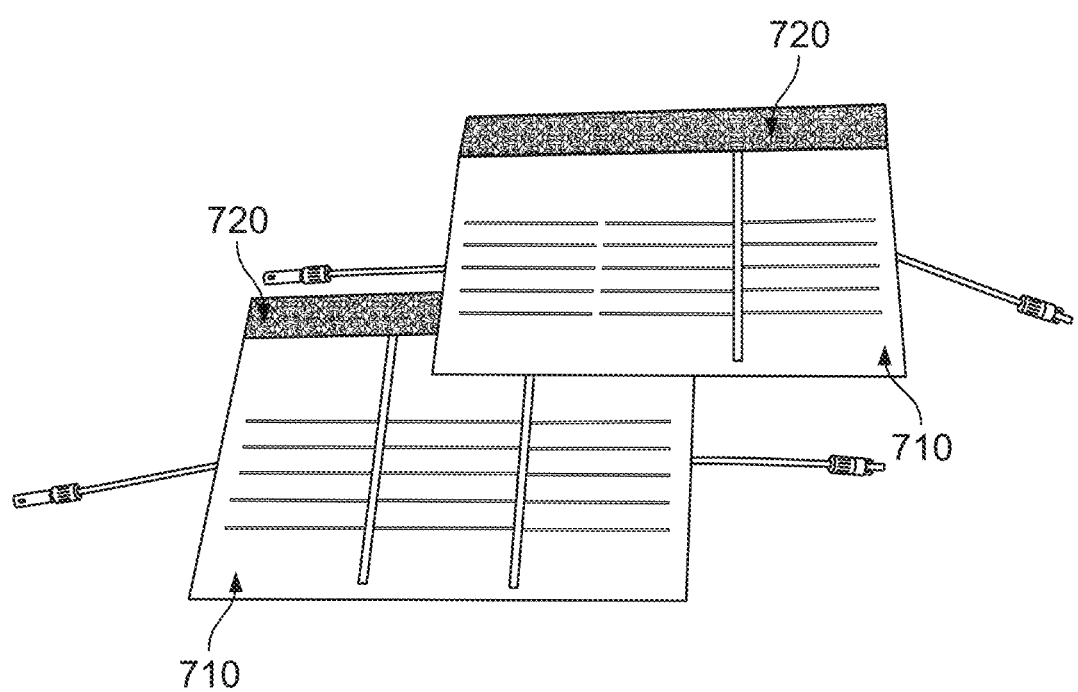
FIG. 7D shows a prototype of FIG. 7A as positioned on a second representative roof deck.

FIGS. 7A and 7B show a rear view and a front view, respectively, of a prototype of a PV module 710 and a spacer 720 attached thereto similar to those shown in FIGS. 4A and 4B. In the prototype shown in FIGS. 7A and 7B, the spacer 720 includes cutouts 730 and 735 configured to accommodate junction boxes 740 and 745, respectively. In the prototype shown in FIGS. 7A and 7B, the spacer 720 includes cutouts 750 and 755 configured to accommodate cables 760 and 765, respectively. FIGS. 7C and 7D show prototypes of the PV module 710 and a spacer 720 attached thereto positioned on representative roof decks.

In some embodiments, a spacer includes cutouts configured to guide cables across the width of a corresponding PV module. FIG. 8A shows a rear view of a PV system including such spacers and corresponding PV modules. FIGS. 8B-8D show cross-sections of the PV system of FIG. 8A taken at locations shown in FIG. 8A. In some embodiments, a spacer 810 is sized to span a width of a PV module 820. In some embodiments, the spacer 810 includes two cutouts 830, 835 that are configured (e.g., sized, shaped, and positioned) to accommodate corresponding junction boxes 840, 845. In some embodiments, the spacer 810 includes at least one cutout 850 that is configured (e.g., sized, shaped, and positioned) to accommodate a corresponding connector 860 (e.g., an electrical connector that electrically connects a given PV module 820 to an adjacent one of the PV module 820). In some embodiments, the spacer 810 includes at least one cutout 870 that is configured (e.g., sized, shaped, and positioned) to accommodate) a corresponding length of wire 880. FIG. 8B shows a cross-sectional view of the spacer 810 at a position including the cutout 850 configured to accommodate the electrical connector 860 and the at least one cutout 870 configured to accommodate the wire 880. FIG. 8C shows a cross-sectional view of the spacer 810 at a position including the cutout 830 configured to accommodate the junction box 840 and the at least one cutout 870 configured to accommodate the wire 880. FIG. 8D shows a cross-sectional view of the spacer 810 at a position including the cutout 835 configured to accommodate the junction box 845 and the cutout 850 configured to accommodate the electrical connector 860. FIG. 8A shows two instances of the spacer 810 and corresponding PV module 820, but it will be apparent to those of skill in the art that a roof-integrated PV system may include any other quantity of the spacer 810 and PV module 820. It further will be apparent to those of skill in the art that the specific sizes, shapes, and positions of the cutouts 830, 835, 850, 870 may vary from those shown in FIGS. 8A-8D. It will further be apparent to those of skill in the art that the dimensions of the cutouts shown in FIGS. 8B-8D are only exemplary, and that any other suitable dimensions may be used to accommodate components (e.g., junction boxes, connectors, wires) of different sizes.

Test Results

Impact Testing

Eight (8) examples of PV module laminates with shock-absorbing spacers were prepared for testing under the UL 1703 impact test in order to quantitatively test the effectiveness of different rear-mounted shock absorbing layers at mitigating failure due to impact. These laminates were all identical and were tested in identical ways, but the independent variable was the shock-absorbing method attached to the rear. Each laminate included a layered structure formed from a glass superstrate, a first polymeric encapsulant layer, at least one PV cell, a second polymeric encapsulant layer, and a polymeric backsheet. The laminates were labeled, benchmarked with flash testing, and modified with shock-absorbing backings as described below. It may be understood to those of skill in the art that flash testing is a standard solar industry process in which the current-voltage curve of the module is determined by exposing it to a short flash of approximately solar light. It may further be understood to those of skill in the art that it is common in impact testing to perform this process and determine the maximum module power both before and after the impact test. The data in Table 1 shows the applicable power loss values for the various samples, along with the average values for each sample type.

Comparative Example 1

Figure 9A:
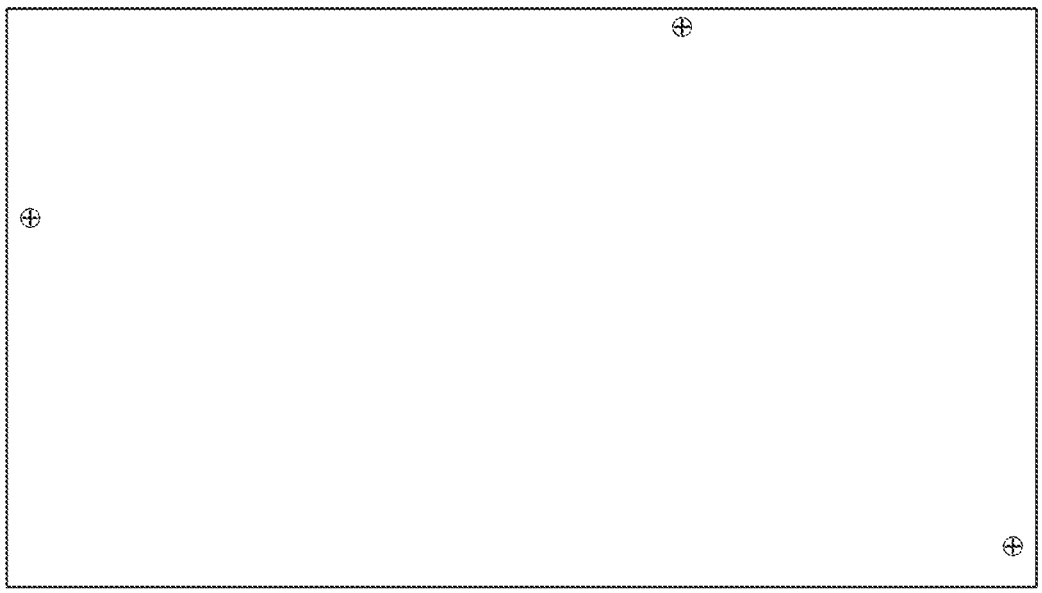
FIG. 9A shows a rear view of an experimental PV module.

In Comparative Example 1, no backing was applied to the laminate. The rear surface of Comparative Example 1 is shown in FIG. 9A.

Example 2

Figure 9B:
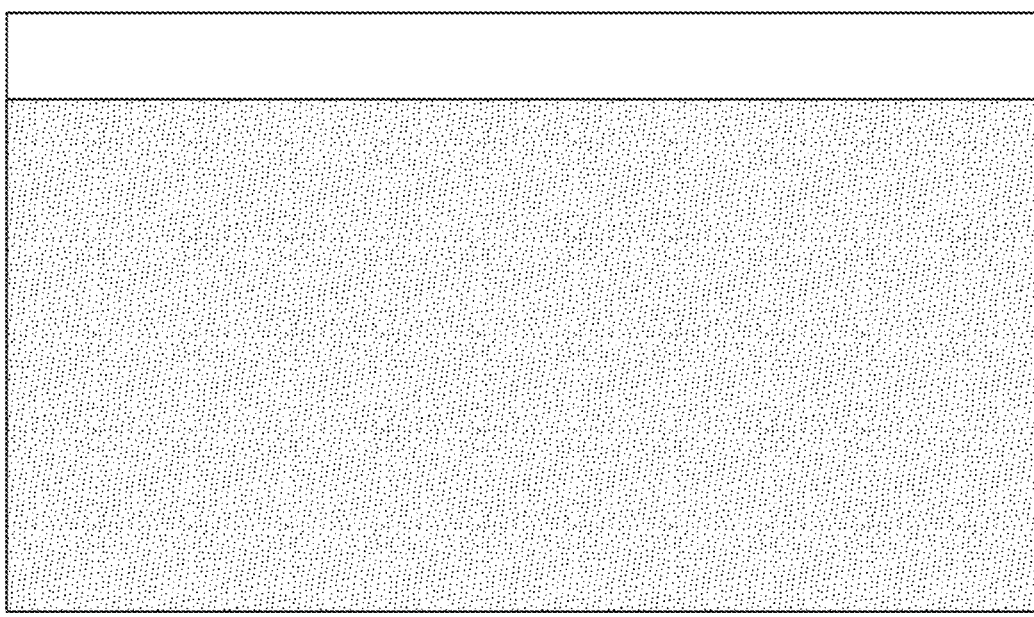
FIG. 9B shows a rear view of an experimental PV module with a first experimental spacer.

In Example 2, a composite fiber wool was placed over the entire rear surface of the laminate. The composite fiber wool was commercialized by GAF of Parsippany, N.J. under the trade name COBRA® EXHAUST VENT. The composite fiber wool was fixed to the laminate by a butyl adhesive. The rear surface of Example 2 is shown in FIG. 9B.

Example 3

Figure 9C:
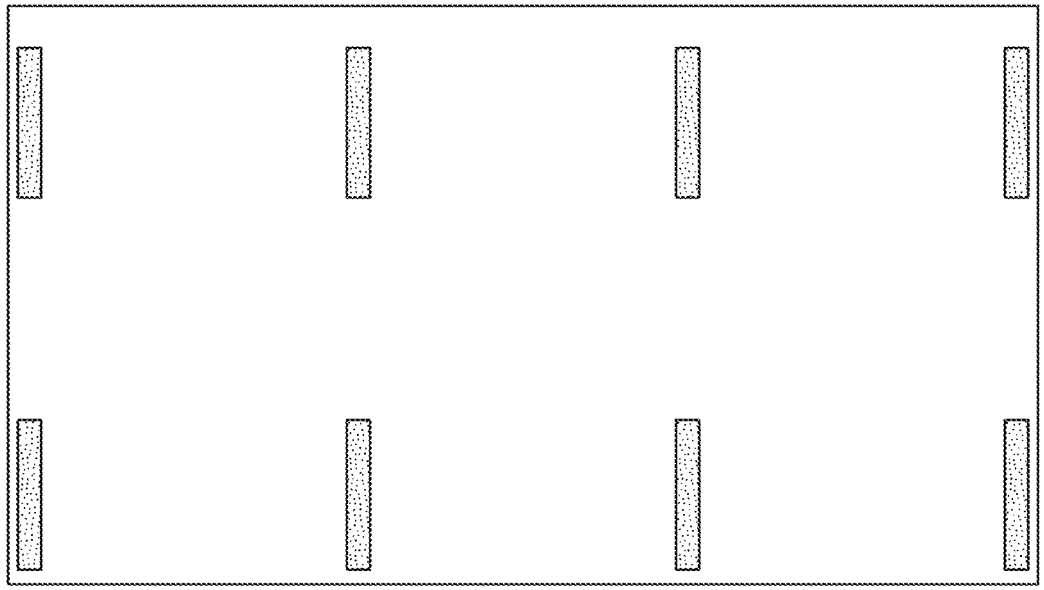
FIG. 9C shows a rear view of an experimental PV module with a second experimental spacer.

In Example 3, segments of an O-ring extrusion were affixed to the rear surface of the laminate. The O-ring extrusion was the ⅜" diameter O-ring made from ethylene propylene diene monomer ("EPDM") rubber commercialized by McMaster-Carr Supply Company of Elmhurst, Ill. as part number 9616K17. The O-ring extrusion was cut into O-ring strips of approximately 2.5 inches in length. The O-ring strips were affixed to the rear surface of the laminate by a cyanoacrylate adhesive of the type commercialized by Henkel Corporation of Dusseldorf, Germany under the trade name LOCTITE 401. The rear surface of Example 3 is shown in FIG. 9C.

Example 4

Figure 9D:
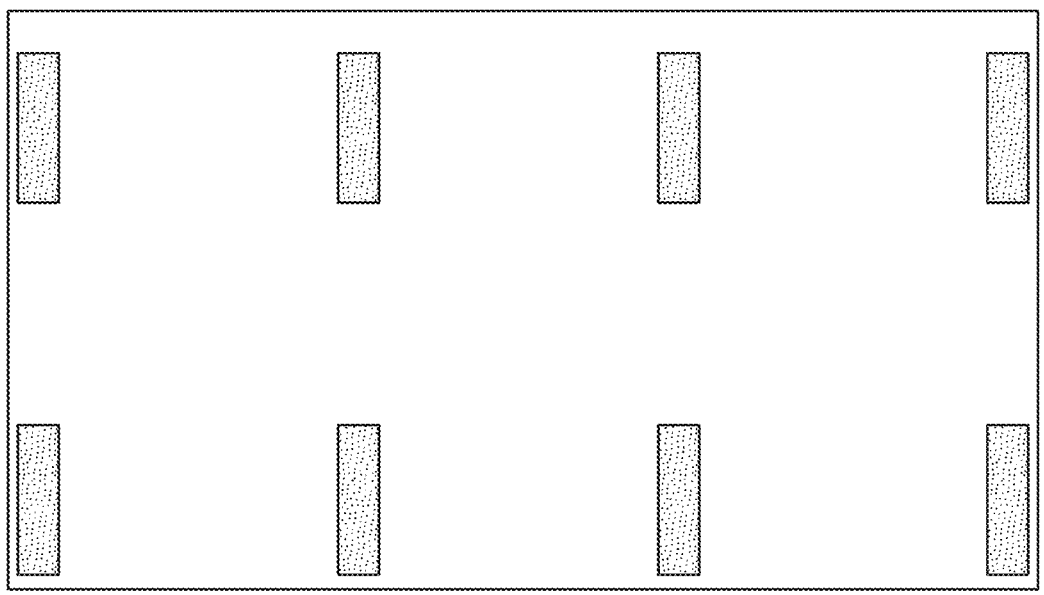
FIG. 9D shows a rear view of an experimental PV module with a third experimental spacer.

In Example 4, segments of an X-ring extrusion were affixed to the rear surface of the laminate. The X-ring extrusion was the ½" width X-ring made from nitrile commercialized by McMaster-Carr Supply Company of Elmhurst, Ill. as part number 1034T2. The X-ring extrusion was cut into X-ring strips of approximately 2.5 inches in length. The X-ring strips were affixed to the rear surface of the laminate by a cyanoacrylate adhesive. The rear surface of Example 4 is shown in FIG. 9D.

Example 5

Figure 9E:
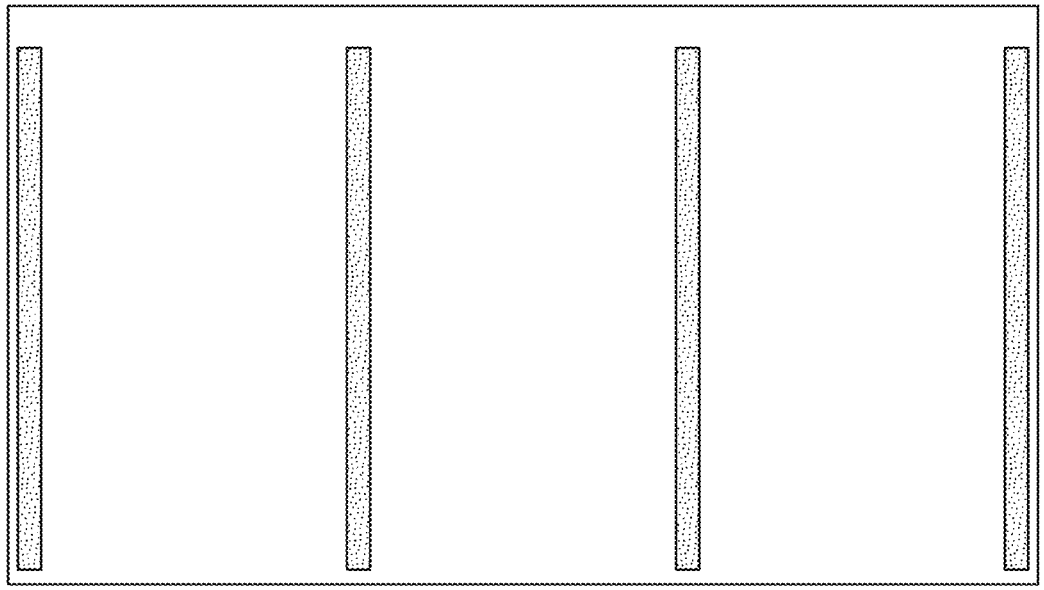
FIG. 9E shows a rear view of an experimental PV module with a fourth experimental spacer.

In Example 5, segments of a tubular extrusion were affixed to the rear surface of the laminate. The tubular extrusion was the ¼" inner diameter, ⅜" outer diameter tube made from EPDM commercialized by McMaster-Carr Supply Company of Elmhurst, Ill. as part number 9776T7. The tubular extrusion was cut into tubular strips spanning substantially the entire height of the laminate. The tubular strips were affixed to the rear surface of the laminate by a cyanoacrylate adhesive. The rear surface of Example 5 is shown in FIG. 9E.

Example 6

Figure 9F:
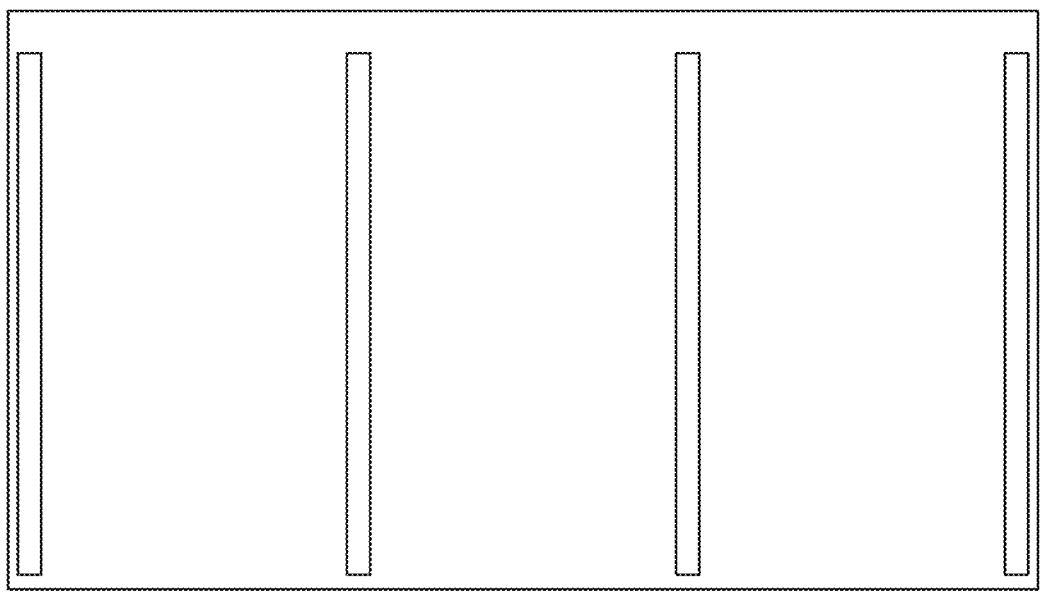
FIG. 9F shows a rear view of an experimental PV module with a fifth experimental spacer.

In Example 6, segments of an edge seal extrusion were affixed to the rear surface of the laminate. The edge seal extrusion was the ³⁷⁄₆₄" height edge seal extrusion made from vinyl commercialized by McMaster-Carr Supply Company of Elmhurst, Ill. as part number 1142A63. The edge seal extrusion was cut into edge seal strips spanning substantially the entire height of the laminate. The edge seal strips were affixed to the rear surface of the laminate by a cyanoacrylate adhesive. The rear surface of Example 6 is shown in FIG. 9F.

Example 7

Figure 9G:
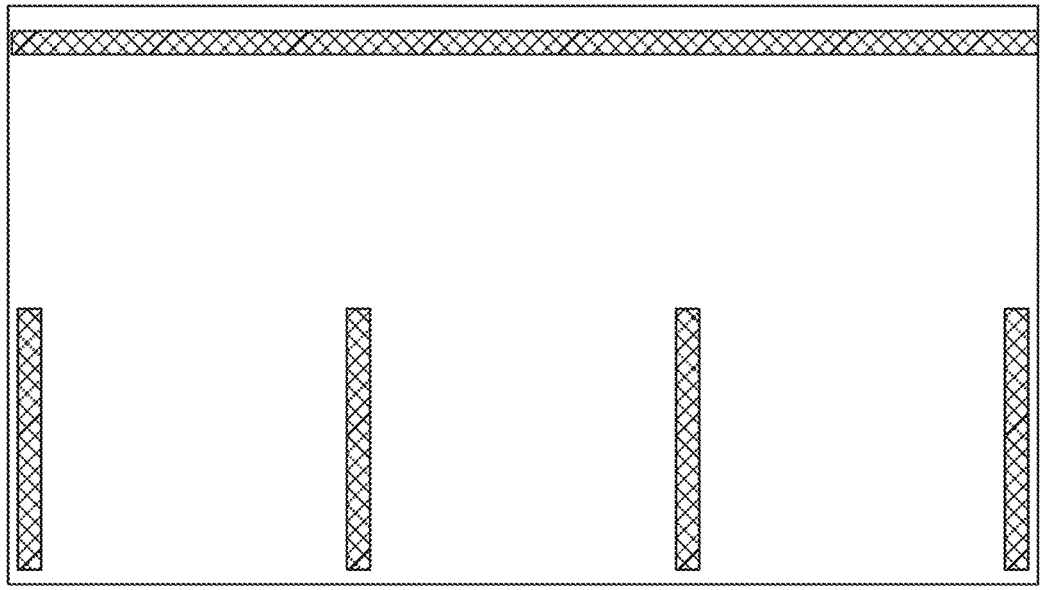
FIG. 9G shows a rear view of an experimental PV module with a sixth experimental spacer.

In Example 7, segments of a D-profile extrusion were affixed to the rear surface of the laminate. The D-profile extrusion was the ⅜" width D-profile extrusion made from silicone foam rubber commercialized by McMaster-Carr Supply Company of Elmhurst, Ill. as part number 9141K128. The D-profile extrusion was cut into D-profile strips spanning substantially the entire height of the laminate. The D-profile strips were affixed to the rear surface of the laminate by a cyanoacrylate adhesive. The rear surface of Example 7 is shown in FIG. 9G.

Example 8

Figure 9H:
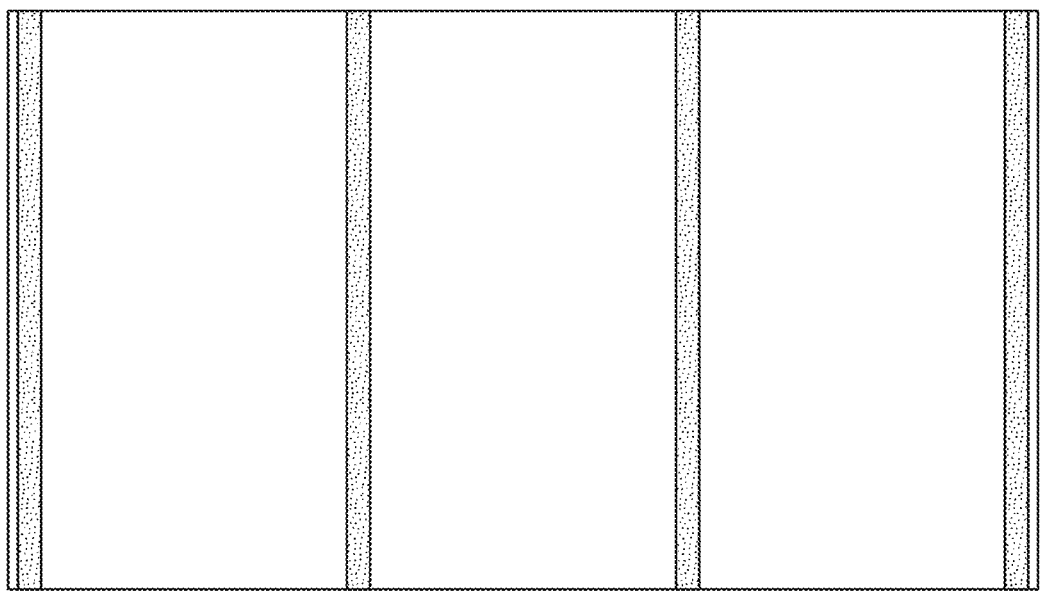
FIG. 9H shows a rear view of an experimental PV module with a seventh experimental spacer.

In Example 8, segments of a foam tape were affixed to the rear surface of the laminate. The foam tape was the ¼" width, ⅜" thickness foam tape made from EPDM foam commercialized by McMaster-Carr Supply Company of Elmhurst, Ill. as part number 8694K137. The foam tape was cut into foam tape strips spanning substantially the entire height of the laminate. The foam tape strips were affixed to the rear surface of the laminate by a pressure-sensitive adhesive. The rear surface of Example 8 is shown in FIG. 9H.

Test Procedure

All samples were hail tested in accordance with UL 1703. Under the UL 1703 test, a 2-inch steel ball bearing is dropped on the laminate from a height of 1.3 meters (51.18 inches). All samples were placed on a test deck and all samples were placed on the same location on the test deck for testing. Each test sample included three regions, labeled "A", "B"," and "C". The samples were placed such that the "A" regions were placed next to a joist on the test deck and the "C" regions were placed furthest from the joist.

Test Results

Figure 10C:
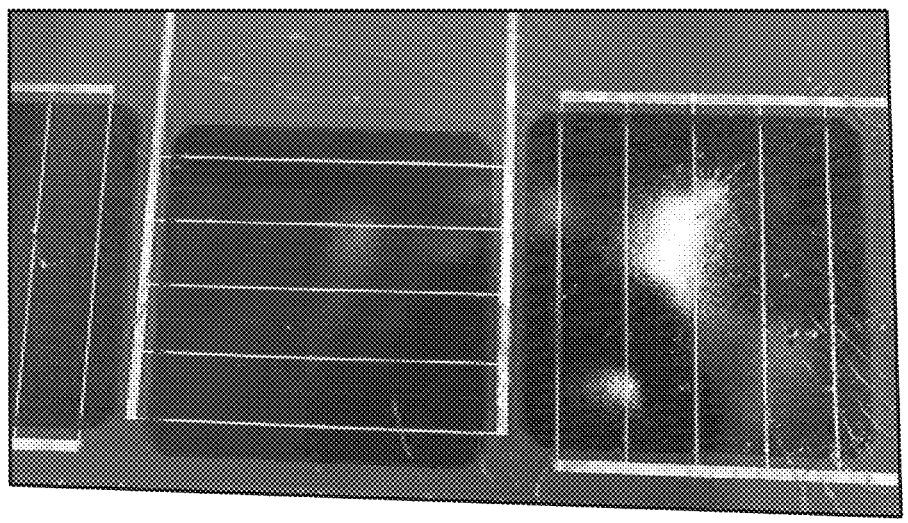
FIG. 10C shows a photograph of a front view of the experimental PV module of FIG. 9F after impact testing.
Figure 10B:
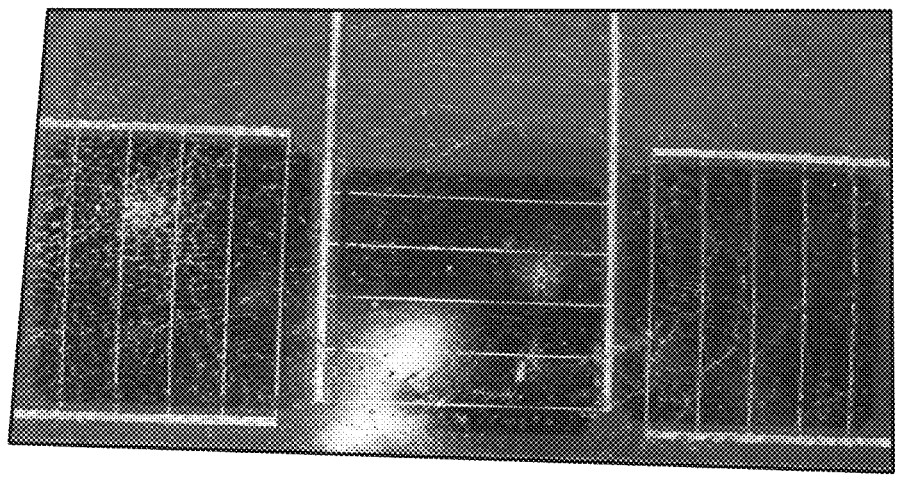
FIG. 10B shows a photograph of a front view of the experimental PV module of FIG. 9C after impact testing.
Figure 10A:
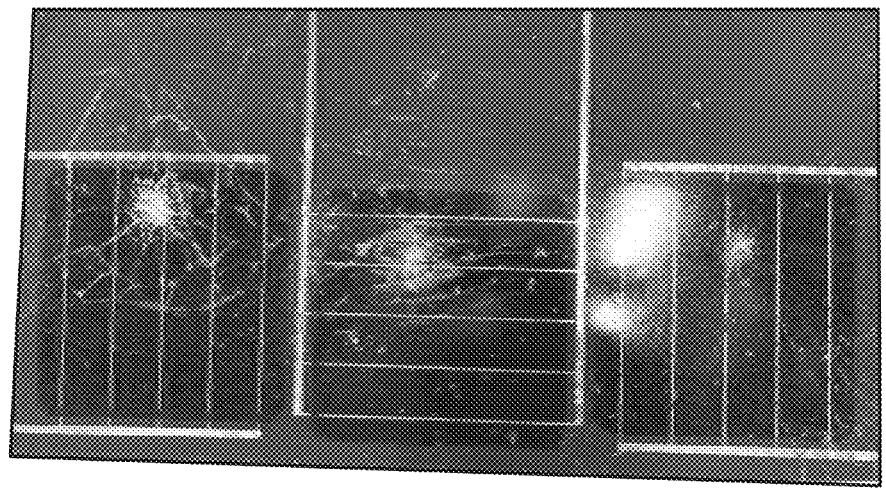
FIG. 10A shows a photograph of a front view of the experimental PV module of FIG. 9A after impact testing.

Of the eight (8) laminates that were tested, three (3) of the laminates shattered under testing. The laminates that shattered were Comparative Example 1, Example 3, and Example 6. Comparative Example 1 shattered under the first ball drop. Example 3 shattered under the second ball drop. Example 6 shattered under the third ball drop. A photograph of Comparative Example 1 after drop testing is shown in FIG. 10A. A photograph of Example 3 after drop testing is shown in FIG. 10B. A photograph of Example 6 after drop testing is shown in FIG. 10C.

Samples that did not shatter were subjected to post-impact flash testing. As discussed above, flash testing is a standard solar industry process in which the current-voltage curve of the module is determined by exposing it to a short flash of approximately solar light, and it is common in impact testing to perform this process and determine the maximum module power both before and after the impact test. The shattered laminates were not subjected to post-impact flash testing. The results of post-impact testing are shown in Table 1 below, and show the applicable power loss values for the various samples, along with the average values for each sample type:

TABLE 1

| | Preparation | Power Loss | Sample Average Power Loss |
|---|---|---|---|
| 1A | Baseline | Fail | Fail |
| 1B | Baseline | Fail | Fail |
| 1C | Baseline | Fail | Fail |
| 2A | Butyl adhesive to Cobra Exhaust vent | 3% | 19% |
| 2B | Butyl adhesive to Cobra Exhaust vent | 29% | 19% |
| 2C | Butyl adhesive to Cobra Exhaust vent | 26% | 19% |
| 3A | CA to ⅜ EPDM O-Ring | Fail | Fail |
| 3B | CA to ⅜ EPDM O-Ring | Fail | Fail |
| 3C | CA to ⅜ EPDM O-Ring | Fail | Fail |
| 4A | CA to ½ nitrile X-Ring | 20% | 17% |
| 4B | CA to ½ nitrile X-Ring | 19% | 17% |
| 4C | CA to ½ nitrile X-Ring | 12% | 17% |
| 5A | CA to EPDM Tube | 2% | 13% |
| 5B | CA to EPDM Tube | 34% | 13% |
| 5C | CA to EPDM Tube | 2% | 13% |
| 6A | CA to Vinyl Edge Seal | Fail | Fail |
| 6B | CA to Vinyl Edge Seal | Fail | Fail |
| 6C | CA to Vinyl Edge Seal | Fail | Fail |
| 7A | CA to Silicone Foam D | 32% | 20% |
| 7B | CA to Silicone Foam D | 27% | 20% |
| 7C | CA to Silicone Foam D | 1% | 20% |
| 8A | PSA to EPDM Foam Tape | 46% | 17% |
| 8B | PSA to EPDM Foam Tape | 2% | 17% |
| 8C | PSA to EPDM Foam Tape | 2% | 17% |

Figure 11:
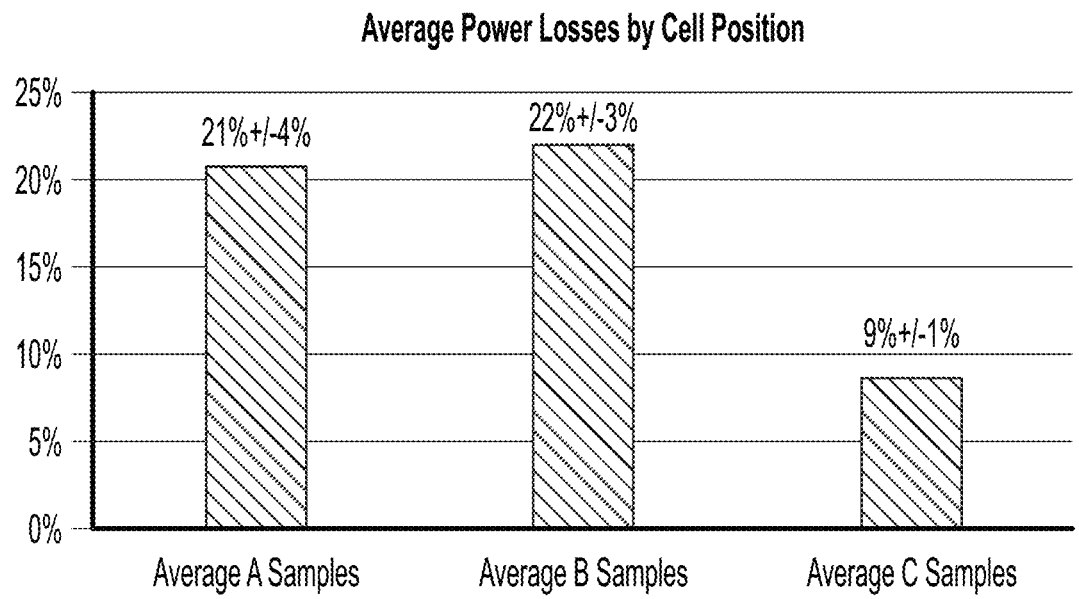
FIG. 11 shows a bar graph tabulating average power losses by cell position for the experimental PV modules of FIGS. 9A-9H.

The effect of the backing stiffness was tracked by the differences between the A, B, and C samples. As noted above, the A samples were placed next to a joist on the test deck, and the C samples were placed furthest from the joist. FIG. 11 shows a bar graph of average power loss by position. It may be seen from FIG. 11 that the cells furthest from a joist tended to fare better than those close to a joist.

Figure 12:
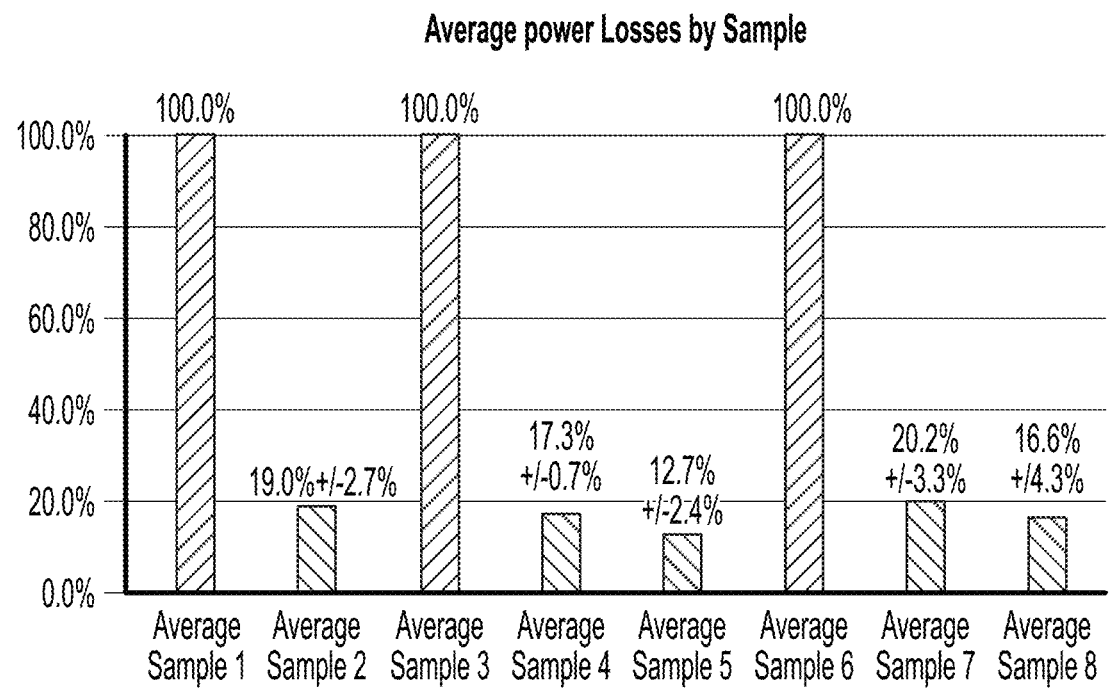
FIG. 12 shows a bar graph tabulating average power losses by sample for the experimental PV modules of FIGS. 9A-9H.

The effect of the different backings, which have different thickness, stiffness, and damping properties, was also tracked. FIG. 12 shows a bar graph of average power for each backing following drop testing. It may be seen that Example 5, which included EPDM tubular extrusions, outperformed the other samples to the range if its deviation. It may further be seen that Example 8, which included EPDM foam tape, outperformed the other samples in two of its cells, but cell 8A saw a 46% power loss, leading to the high deviation range of Example 8.

Ventilation Testing

Figure 13:
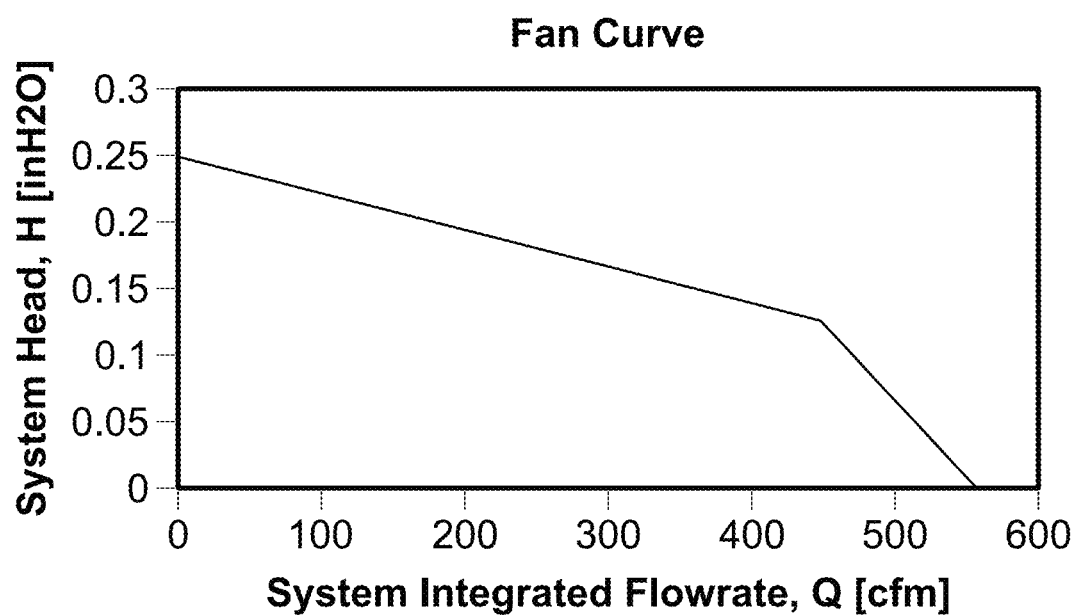
FIG. 13 shows a fan curve for an experimental fan.

Testing was conducted to determine the characteristics of an exemplary fan, characterize the effects of back-spacing with an exemplary spacer, and characterize the effects of back-spacing and ventilating. During the ventilation testing, a roofing shingle was positioned on a representative roof deck using a composite fiber wool as a spacer. The roofing shingle was the roofing shingle commercialized by GAF of Parsippany, N.J. under the trade name TIMBERLINE ULTRA HD® BIRCHWOOD REFLECTOR SERIES™ and had a reflectivity of 0.2 and an emissivity of 0.92. The composite fiber wool is commercialized by GAF of Parsippany, N.J. under the trade name COBRA® EXHAUST VENT and had a thickness of ¾ inch. A fan was positioned and configured so as to pull air through the spacer while pressure drop, several velocities, and thermal characteristics were measured. The fan used was the fan commercialized by GAF of Parsippany, N.J. under the trade name MASTER FLOW® GREEN MACHINE™ HIGH-POWER SOLAR ROOF VENT. The fan was operated using only AC power; generally, a fan operated using solar power experiences approximately a 20% performance drop as compared to AC power. FIG. 13 shows a chart of system head pressure against flow rate for the fan that was used during this experiment.

Figure 14:
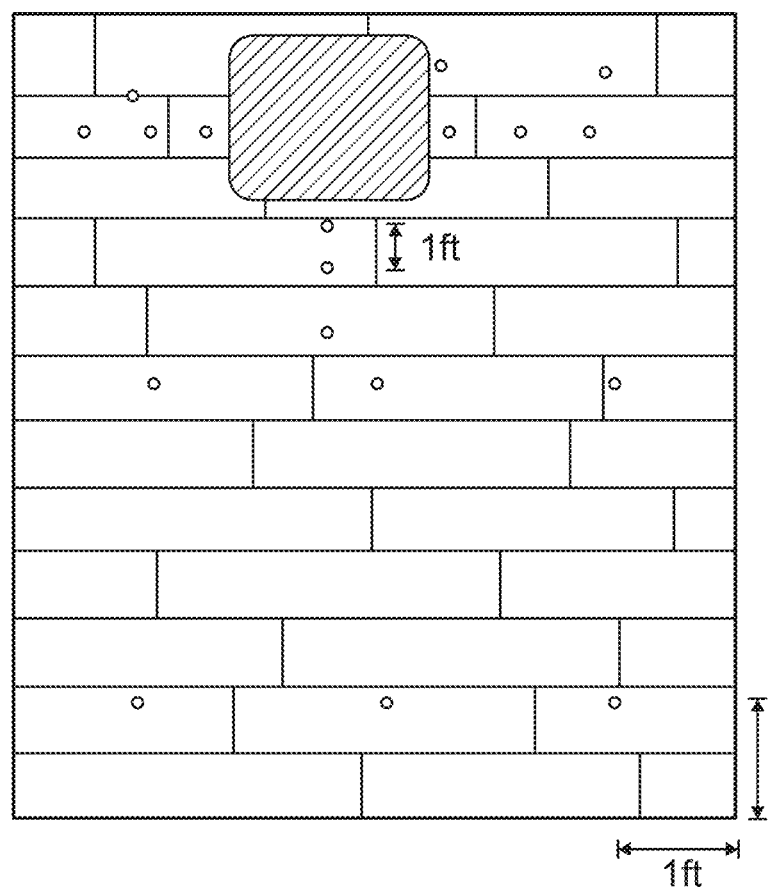
FIG. 14 shows an illustration of data collection locations during heat dissipation testing.

Data was collected both with the fan off and with the fan on and was collected at various locations relative to the center of the lifted portion of the roof and (while the fan was in use) relative to the edge of the fan. FIG. 14 shows an illustration of data collection locations during data collection as described herein. FIG. 15 shows test data collected while the fan was off. FIG. 16 shows test data collected while the fan was on and with the top edge of the raised portion of the fan covered with a layer of shingles to block air flow.

Figures 19, 20:
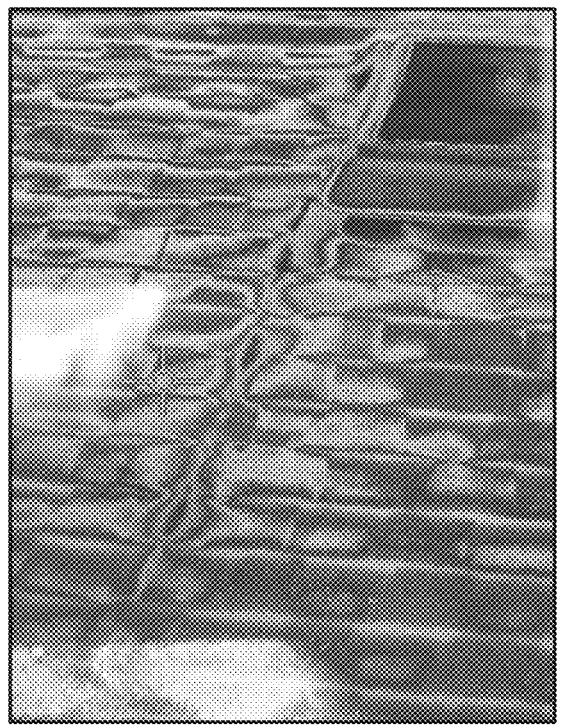
FIG. 19 shows a tabular view of comparative test data for a roofing shingle obtained with a conventional underlayment and without a fan.
FIG. 20 shows a forward-looking infrared image of the experimental roofing shingle and spacer taken during use of an experimental fan.

A 1-D (e.g., one-dimensional) model was applied to the collected data to convert the collected data to standard conditions through the use of a steady-state heat transfer approximation with measured thermal resistances in the roof to translate temperature measurements on a specific day to conditions matching a different day. FIG. 17 shows a table summarizing the measured data collected while the fan was off and corresponding calculated values for standard conditions. FIG. 18 shows a table summarizing the measured data collected while the fan was on and corresponding calculated values for standard conditions. FIG. 19 shows a table summarizing comparative measured data collected in the absence of the experimental spacer (e.g., with a standard underlayment) and without a fan. FIG. 20 shows a forward-looking infrared ("FLIR") image taken during the collection of data while the fan was on. It may be seen by comparing FIGS. 17 and 19 (and, more particularly, the respective calculated equivalent average surface temperatures provided therein) that the experimental spacer provided a 5° C. decrease in average temperature as compared to a standard underlayment. It may be seen by comparing FIGS. 17 and 18 that adjusted temperatures during the forced ventilation case (i.e., with the fan on) and during the free ventilation case (i.e., with the fan off) were roughly equal to one another. It may be inferred based on the FLIR image of FIG. 20 that that the roughly equal adjusted temperatures may be a result of small air gaps between the shingles inhibiting the spread of cooling.

Crush Strength Testing

Figure 21:
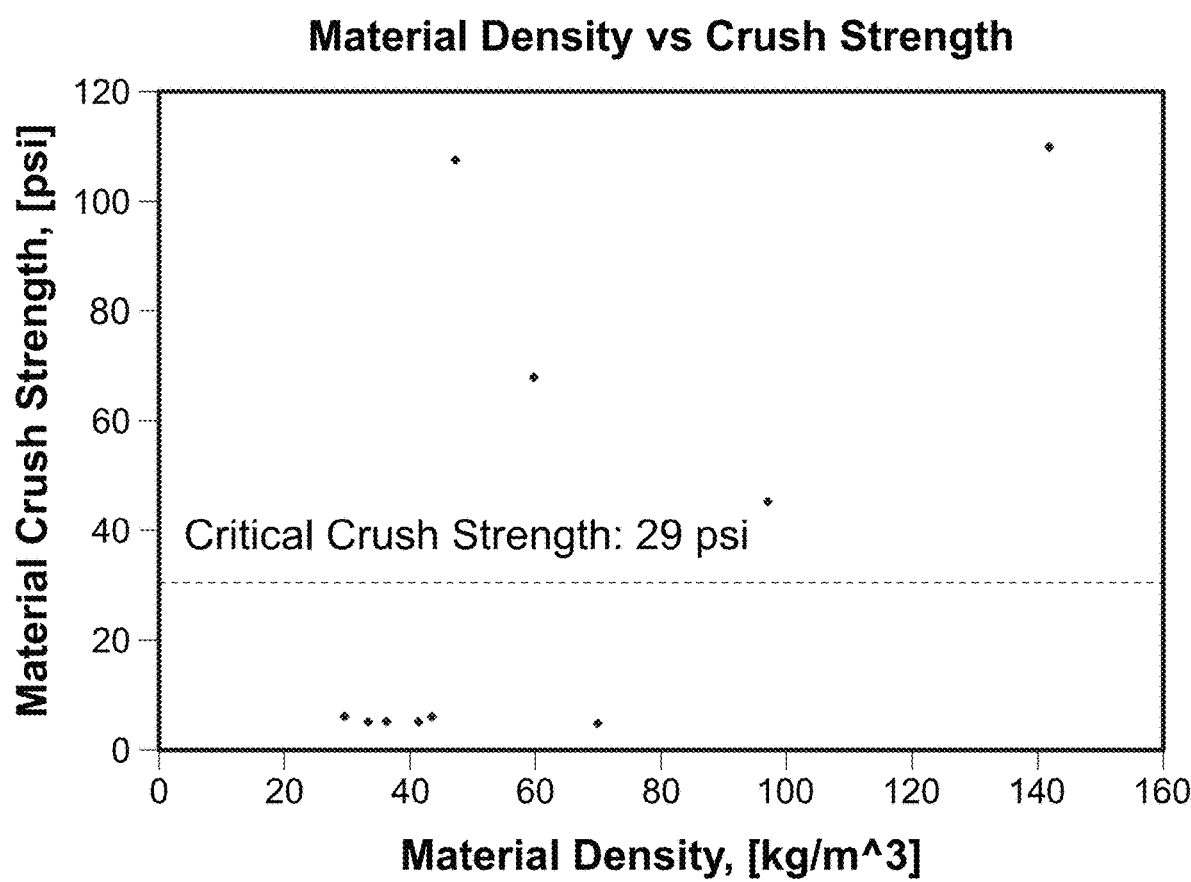
FIG. 21 is a graph of comparative test data of material density versus crush strength for embodiments of photovoltaic modules including spacers.

Table II below is a summary of test data of density versus crush strength for ten comparative samples of a photovoltaic module having a spacer. Nine of the samples included a spacer having composite fiber wool and one of the samples included a spacer including polyisocyanurate (polyiso) foam. The test method utilized for the comparative samples included that under the UL 7103 standard for walkability, as described above. As shown in Table II, Comparative Samples 1, 2, 9 and 10 exceeded a critical crush strength level of 29 psi to pass the UL 7103 standard for walkability. FIG. 21 is a graph of comparative test data of material density versus crush strength for these comparative samples.

TABLE II

| Comparative Sample | Material | Density, [kg/m³] | Crush Strength, [psi] |
| --- | --- | --- | --- |
| 1 | Composite fiber wool | 97 | 45.28 |
| 2 | Composite fiber wool | 60 | 67.92 |
| 3 | Composite fiber wool | 36 | 5.05 |
| 4 | Composite fiber wool | 43 | 5.95 |
| 5 | Composite fiber wool | 33 | 5.26 |
| 6 | Composite fiber wool | 30 | 5.95 |
| 7 | Composite fiber wool | 41 | 5.18 |
| 8 | Composite fiber wool | 70 | 5.03 |
| 9 | Composite fiber wool | 47 | 107.44 |
| 10 | Polyiso Foam | 142 | 110 |

While a number of embodiments of the present invention have been described, it is understood that these embodiments are illustrative only, and not restrictive, and that many modifications may become apparent to those of ordinary skill in the art. Further still, the various steps may be carried out in any desired order (and any desired steps may be added and/or any desired steps may be eliminated). All such variations and modifications are intended to be included within the scope of the invention as defined in the appended claims.

What is claimed is:

1. A system, comprising:
a plurality of photovoltaic modules,
wherein the plurality of photovoltaic modules includes a first photovoltaic module and a second photovoltaic module,
each of the photovoltaic modules including
a first end,
a second end opposite the first end,
a first surface extending from the first end to the second end,
a second surface opposite the first surface and extending from the first end to the second end, and
at least one spacer juxtaposed with the second surface,
wherein the at least one spacer includes a mat of fiber wool,
wherein the fibers form an air-permeable mesh,
wherein the at least one spacer includes a density of 40 kg/m³ to 150 kg/m³ and a crush strength of 29 psi to 200 psi,
wherein the at least one spacer is positioned between the second surface and the roof deck, and
wherein the at least one spacer includes a nail plate configured to receive at least one nail,
wherein the plurality of photovoltaic modules is configured to be installed on a roof deck, and
a fan installed on the roof deck and adjacent to the at least one of the plurality of photovoltaic modules,
wherein the fan is configured to exhaust air through the at least one spacer of the at least one of the photovoltaic modules,
wherein the at least one spacer of each of the first photovoltaic module and the second photovoltaic module covers a portion of the second surface of the first or second photovoltaic module, wherein an uncovered portion of the second surface of the first photovoltaic module overlaps the first surface of the second photovoltaic module,
a watershedding layer located between the at least one spacer and the roof deck.

2. The system of claim 1, wherein the second surface includes a surface area, and wherein the at least one spacer covers the surface area in its entirety.

3. The system of claim 1, wherein the second surface includes a surface area, and wherein the at least one spacer covers at least a portion of the surface area.

4. The system of claim 1, wherein at least a portion of the at least one spacer extends outwardly from the first end.

5. The system of claim 1, wherein the at least one spacer includes a plurality of spacers.

6. The system of claim 5, wherein the plurality of spacers is arranged in an array.

7. The system of claim 6, wherein each of the plurality of spacers includes a rectangular profile.

8. The system of claim 6, wherein each of the plurality of spacers includes a circular profile.

9. The system of claim 1, wherein the at least one spacer is attached to the second surface.

10. The system of claim 1, wherein the at least one spacer includes a thickness of 5 mm to 50 mm.

11. The system of claim 1, wherein the at least one spacer includes at least one cutout that is sized and shaped to receive at least one electrical component.

12. The system of claim 11, wherein the at least one electrical component includes a junction box.

13. The system of claim 11, wherein the at least one electrical component includes an electrical connector.

14. The system of claim 1, wherein the at least one spacer of the first photovoltaic module is proximate to the at least one spacer of the second photovoltaic module.

15. The system of claim 1, further comprising at least one hooking loop adapted to be attached to the roof deck, wherein the at least one hooking loop is configured to engage the at least one spacer.

16. The system of claim 1, wherein the fiber wool is a composite fiber wool.

* * * * *